(12) United States Patent
Mui et al.

(10) Patent No.: US 9,595,345 B2
(45) Date of Patent: Mar. 14, 2017

(54) ADAPTIVE SELECTIVE BIT LINE PRE-CHARGE FOR CURRENT SAVINGS AND FAST PROGRAMMING

(71) Applicant: SanDisk Technologies Inc., Plano, TX (US)

(72) Inventors: Man L Mui, Santa Clara, CA (US); Yee Lih Koh, Fremont, CA (US); Yenlung Li, San Jose, CA (US); Cynthia Hsu, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/454,702

(22) Filed: Aug. 7, 2014

(65) Prior Publication Data

US 2016/0042802 A1    Feb. 11, 2016

(51) Int. Cl.
*G11C 16/00* (2006.01)
*G11C 16/34* (2006.01)
(Continued)

(52) U.S. Cl.
CPC ...... *G11C 16/3459* (2013.01); *G11C 11/5628* (2013.01); *G11C 16/10* (2013.01);
(Continued)

(58) Field of Classification Search
CPC ............ G11C 16/0458; G11C 16/0466; G11C 16/0483; G11C 16/10; G11C 16/24;
(Continued)

(56) References Cited

U.S. PATENT DOCUMENTS 6,088,276 A * 7/2000 Ukita ................... G11C 7/1051
365/207
7,046,568 B2    5/2006 Cernea
(Continued)

FOREIGN PATENT DOCUMENTS

WO    WO 2014066263 A1 * 5/2014

OTHER PUBLICATIONS

International Search Report & The Written Opinion of the International Searching Authority dated Oct. 28, 2015, International Application No. PCT/US2015/042309.

*Primary Examiner* — Tan T Nguyen
(74) *Attorney, Agent, or Firm* — Vierra Magen Marcus LLP

(57) ABSTRACT

Techniques are provided for efficiently performing programming operations in a memory device. In particular, power consumption is reduced in sensing circuitry by avoiding pre-charging of bit lines for certain memory cells at certain times during a programming operation. One approach uses knowledge of the different phases of a programming operation to reduce the number of unnecessary bit line pre-charges. For example, during the lower program loop numbers of a programming operation, bit line pre-charging may occur for lower data states but not for higher data states. Similarly, during the higher program loop numbers, bit line pre-charging may occur for higher data states but not for lower data states. In another approach, which may or may not incorporate knowledge of the different phases of a programming operation, the setting of the bit line pre-charge can be updated at least once after it is initially set in the verify portion.

20 Claims, 15 Drawing Sheets

(51) Int. Cl.
*G11C 16/10* (2006.01)
*G11C 16/26* (2006.01)
*G11C 11/56* (2006.01)
*G11C 16/24* (2006.01)
*G11C 16/04* (2006.01)

(52) U.S. Cl.
CPC .............. *G11C 16/24* (2013.01); *G11C 16/26* (2013.01); *G11C 11/5642* (2013.01); *G11C 11/5671* (2013.01); *G11C 16/0466* (2013.01); *G11C 16/0483* (2013.01); *G11C 2211/5621* (2013.01)

(58) Field of Classification Search
CPC ..... G11C 16/26; G11C 16/34; G11C 16/3436; G11C 16/3459; G11C 11/5642; G11C 11/5671; G11C 2211/5621
USPC .......................... 365/185.22, 185.03, 185.28
See application file for complete search history.

(56) References Cited

U.S. PATENT DOCUMENTS

| | | | |
|---|---|---|---|
| 7,492,640 B2* | 2/2009 | Mokhlesi | G11C 16/26 365/185.02 |
| 8,154,923 B2* | 4/2012 | Li | G11C 11/5642 365/185.03 |
| 8,630,120 B2* | 1/2014 | She | G11C 16/26 365/185.18 |
| 8,797,800 B1* | 8/2014 | Dong | H01L 27/11551 365/185.05 |
| 2006/0140007 A1 | 6/2006 | Cernea et al. | |
| 2008/0055998 A1 | 3/2008 | Jung et al. | |
| 2008/0158985 A1* | 7/2008 | Mokhlesi | G11C 11/5642 365/185.21 |
| 2009/0296487 A1* | 12/2009 | Murin | G11C 11/5642 365/185.21 |
| 2010/0329032 A1 | 12/2010 | Lim | |
| 2011/0188317 A1 | 8/2011 | Mui et al. | |
| 2012/0014184 A1* | 1/2012 | Dutta | G11C 11/5628 365/185.19 |
| 2013/0336071 A1 | 12/2013 | Kwon et al. | |
| 2014/0025866 A1 | 1/2014 | Kim et al. | |
| 2014/0112075 A1 | 4/2014 | Dunga et al. | |
| 2014/0293702 A1* | 10/2014 | Dong | H01L 27/11519 365/185.17 |

* cited by examiner

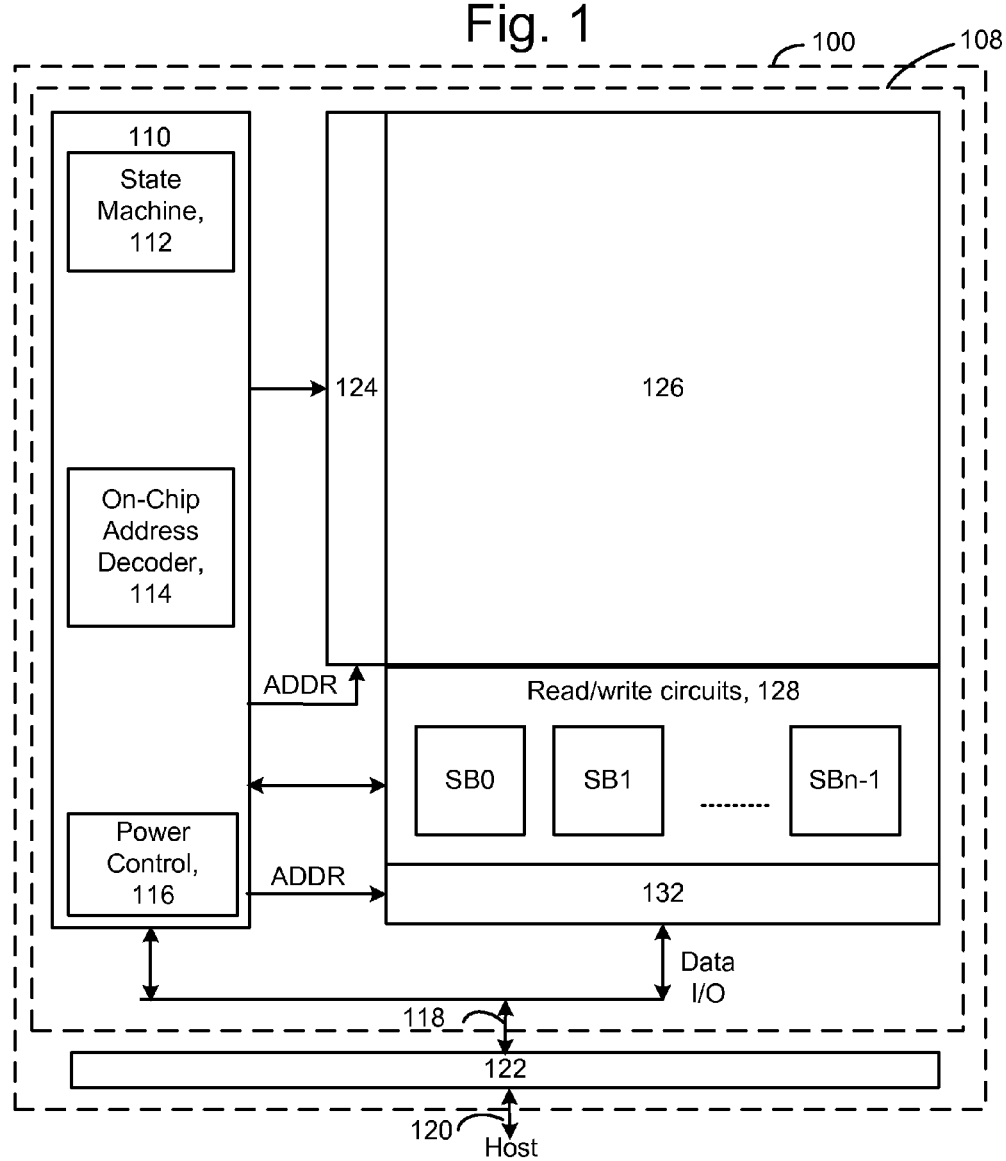

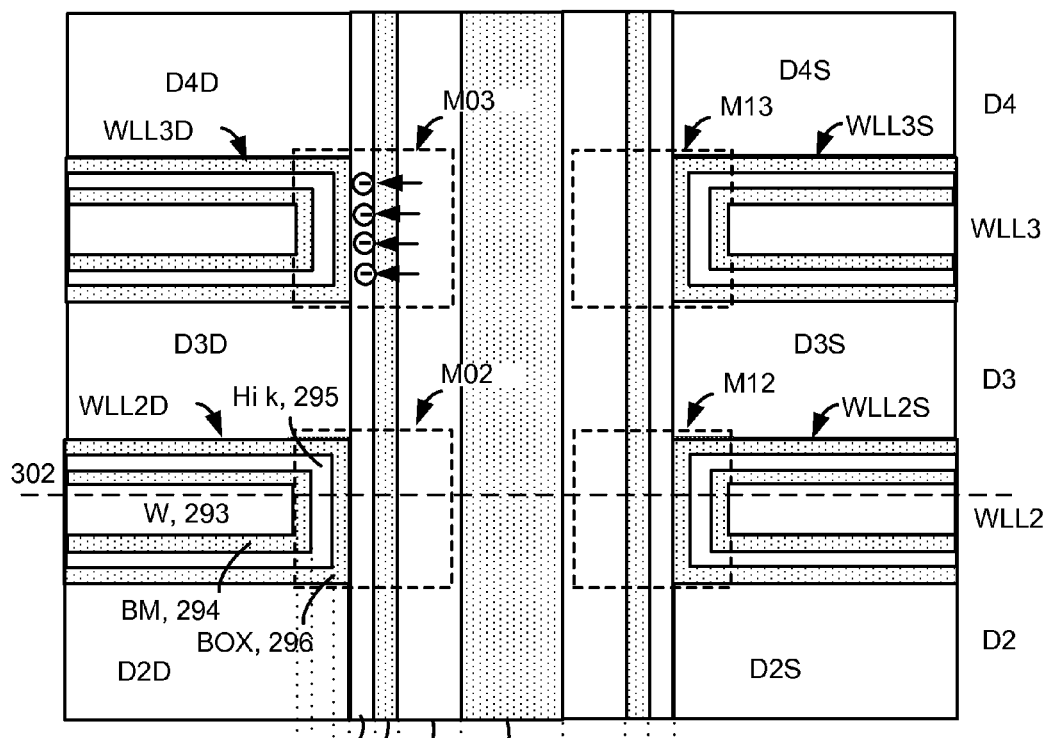
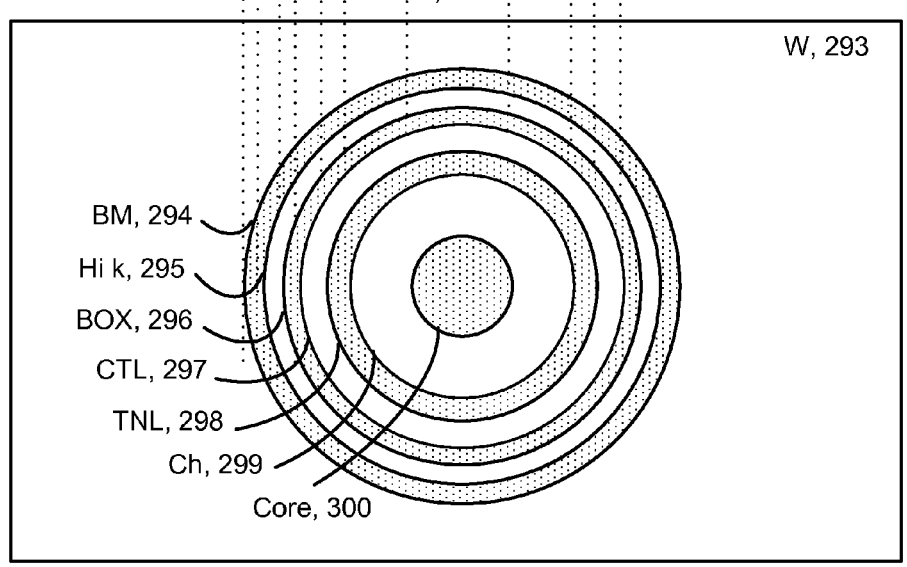

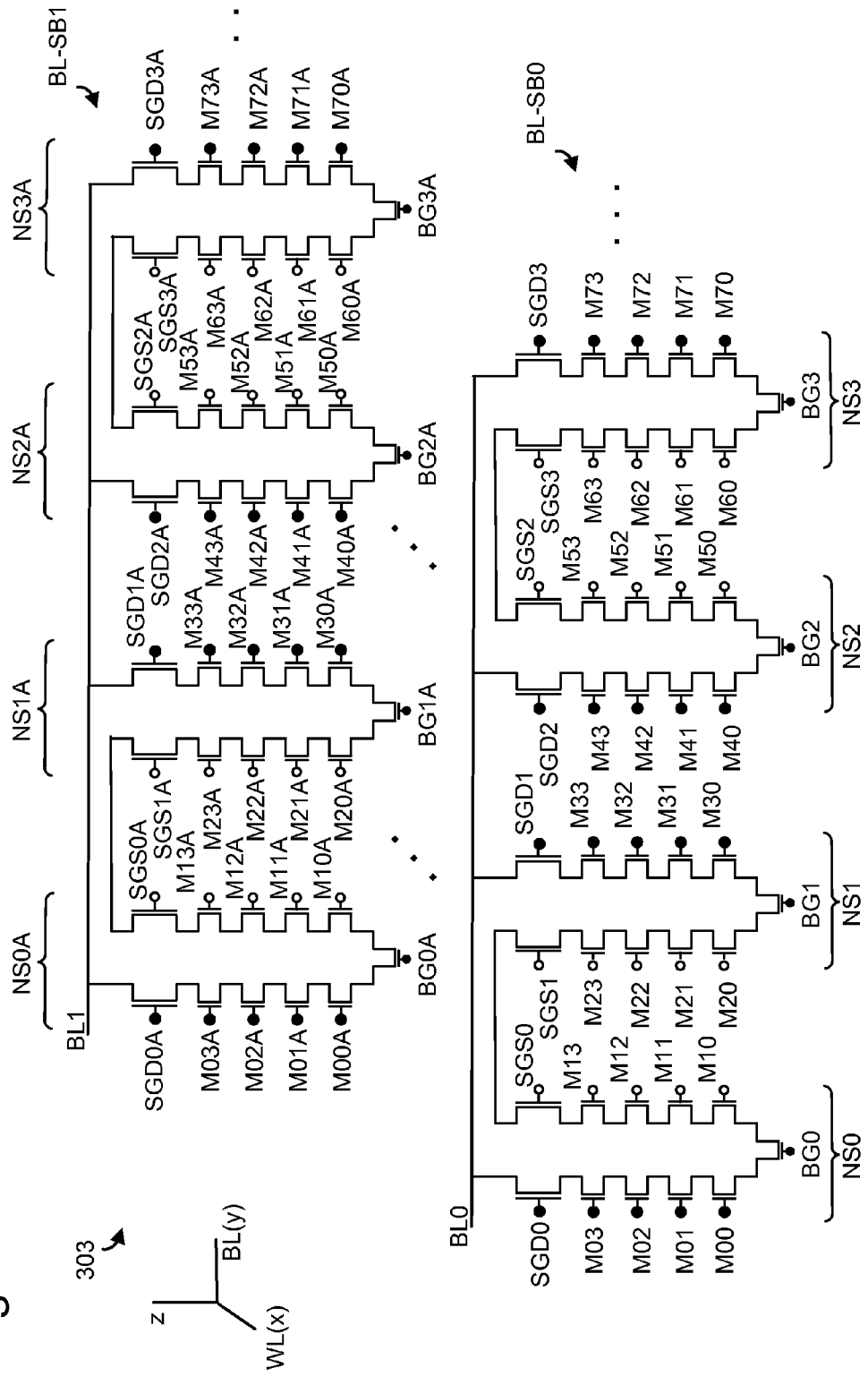

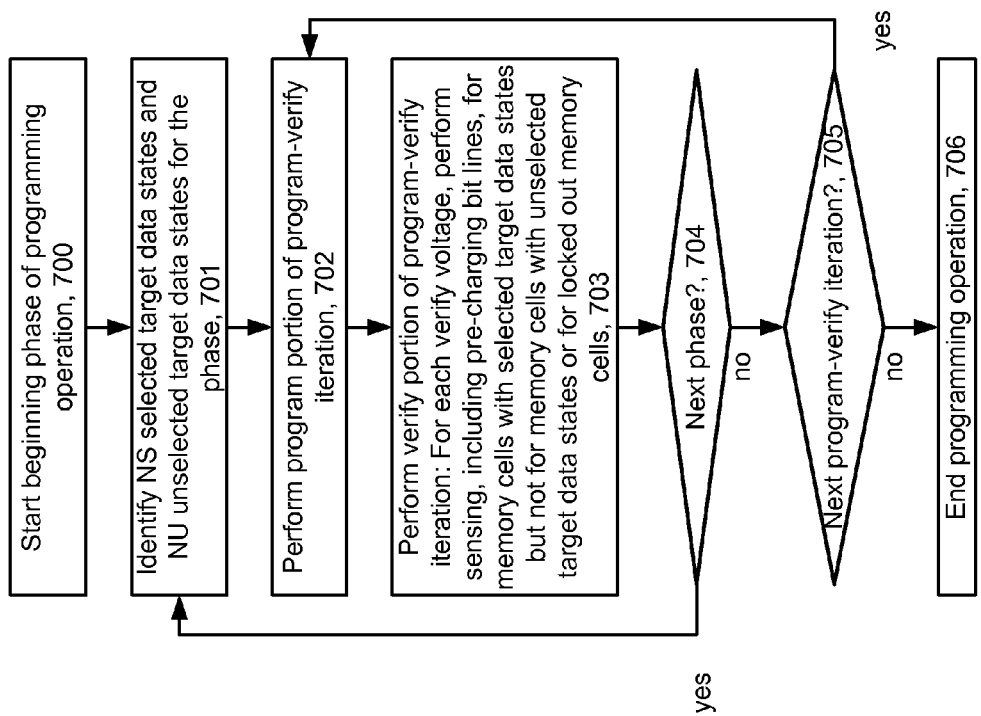

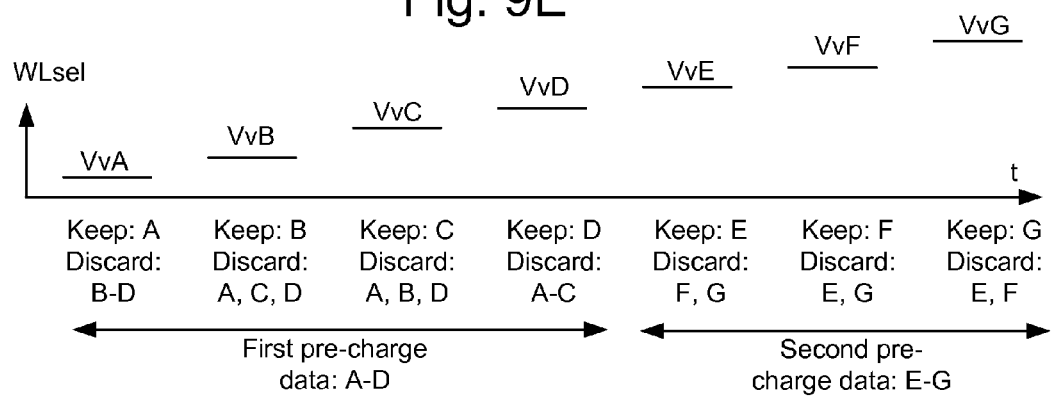
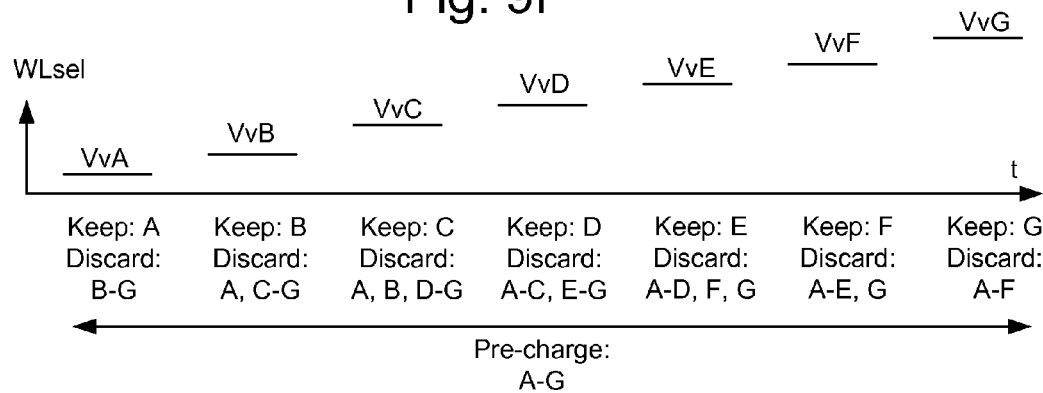

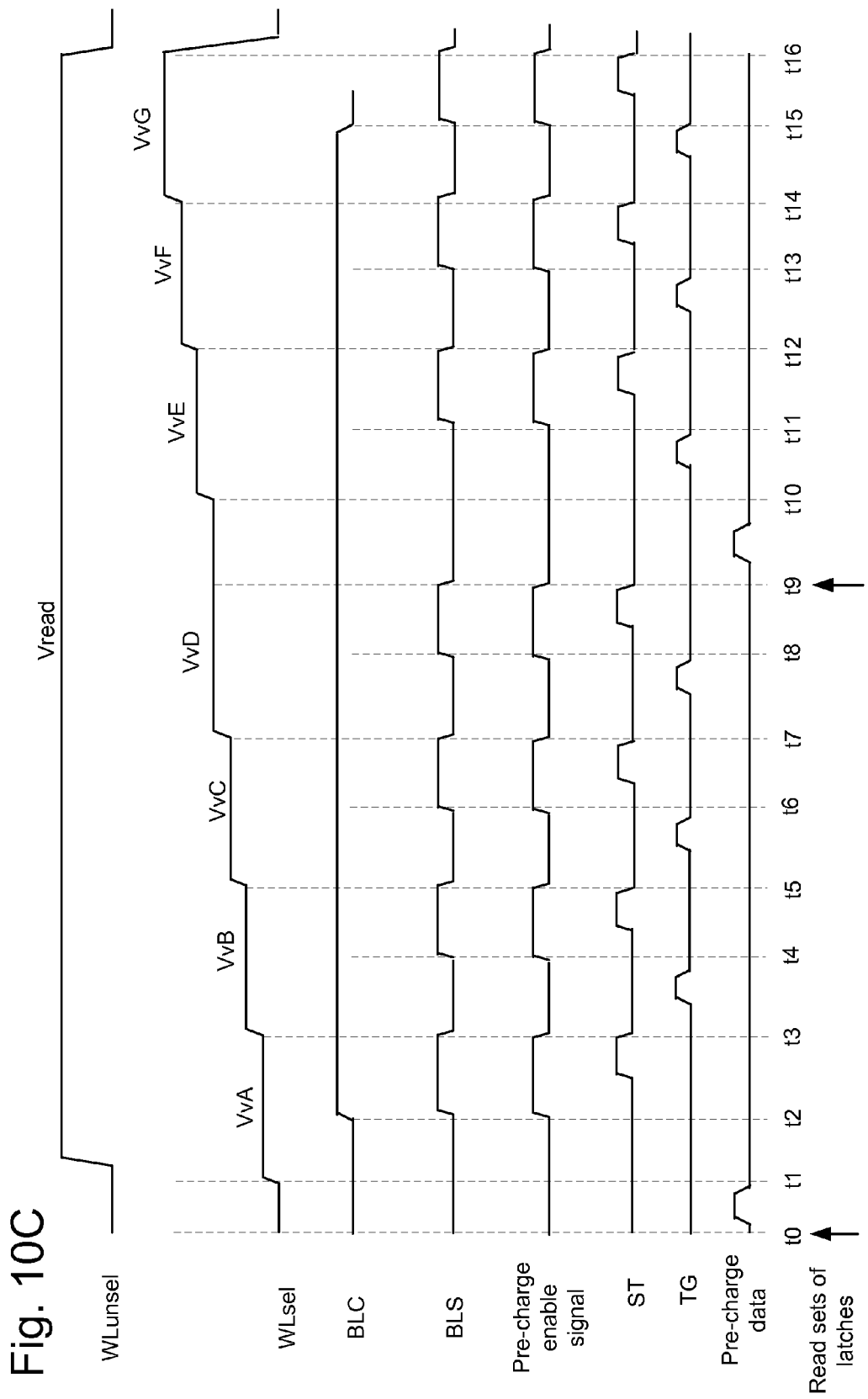

ADAPTIVE SELECTIVE BIT LINE PRE-CHARGE FOR CURRENT SAVINGS AND FAST PROGRAMMING

BACKGROUND

The present technology relates to programming operations in a memory device. Semiconductor memory has become increasingly popular for use in various electronic devices. For example, non-volatile semiconductor memory is used in cellular telephones, digital cameras, personal digital assistants, mobile computing devices, non-mobile computing devices and other devices. Flash memory is among the most popular type of non-volatile semiconductor memories. With flash memory, the contents of an entire memory array can be erased in one step.

For example, two-dimensional NAND memory is one type of flash memory in which a floating gate is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Recently, ultra high density storage devices have been proposed using a three-dimensional memory structure. One example is the Bit Cost Scalable (BiCS) architecture in which the memory device is formed from an array of alternating conductive and dielectric layers. A memory hole is formed in the layers and the hole is filled with charge-storing materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

Techniques are desired for efficiently performing programming operations in a memory device.

BRIEF DESCRIPTION OF THE DRAWINGS

Like-numbered elements refer to common components in the different figures.

FIG. 1 is a functional block diagram of a non-volatile memory device.

FIG. 3A depicts a cross-sectional view of a portion of a NAND string of FIG. 2A in an example three-dimensional memory device.

FIG. 3B depicts a cross-sectional view along line 302 of FIG. 3A.

FIG. 3C depicts an example circuit in a three-dimensional memory device which includes the NAND string of FIG. 3A.

FIG. 7A depicts an example process in which sensing, including pre-charging of bit lines, occurs according to a current phase of a multi-phase programming operation.

FIG. 9E depicts a verify sequence corresponding to the first and second pre-charge data of FIG. 9B, where the first pre-charge data is used while verifying states A-D and the second pre-charge data is used while verifying states E-G.

FIG. 9F depicts a verify sequence which is an alternative to FIG. 9E, where the same pre-charge data is used while verifying states A-G.

FIG. 10C depicts control signals and voltage waveforms for the verify portion of a program-verify iteration consistent with the SM0 of FIG. 10A and with FIG. 9E.

DETAILED DESCRIPTION

Figure 2A:
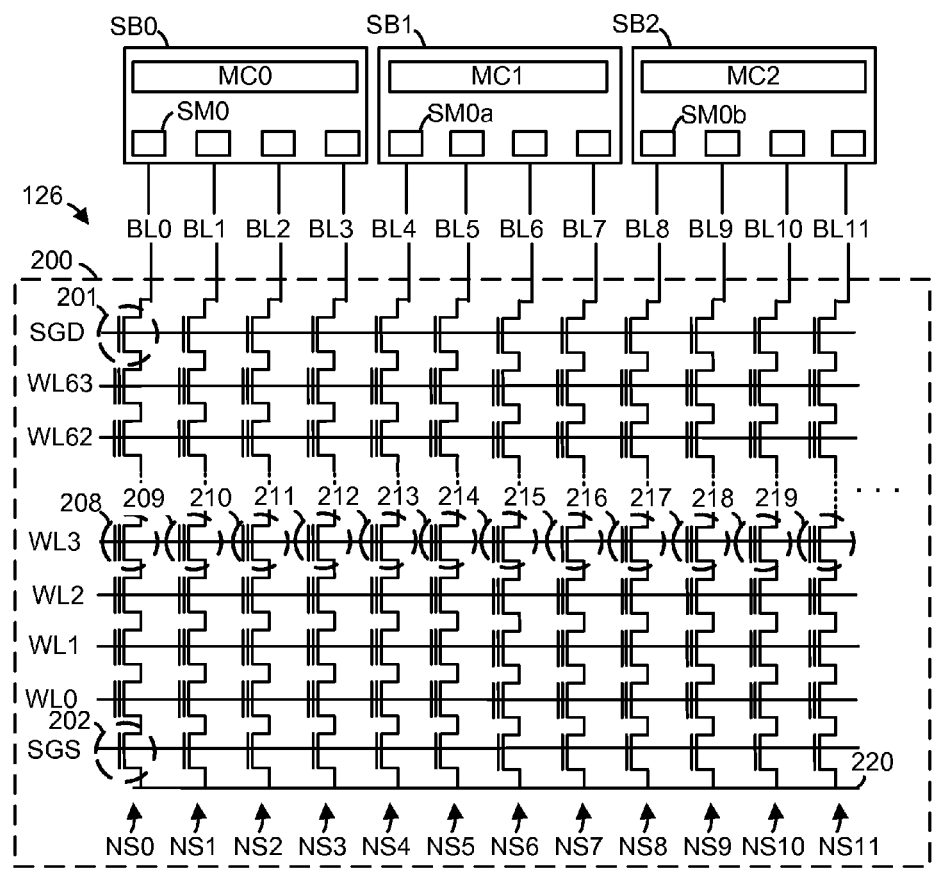
FIG. 2A depicts a block of NAND strings in the memory structure 126 of FIG. 1 and associated sense blocks SB0, SB0a and SB0b.

Techniques are provided for efficiently performing programming operations in a memory device. In particular, power consumption is reduced in sensing circuitry by avoiding pre-charging of bit lines for certain memory cells at certain times during a programming operation.

During a programming operation, a series of program voltages are applied to a set of selected memory cells, causing the threshold voltages (Vth) of the memory cells to move from a lower level such as from an erased state to a higher level which represents a target data state of each cell. For example, in a four-level memory device, the target data states may be referred to as the A, B and C states. The other state is the erased state. To tighten the Vth distribution, verify operations are done between the program voltages. Once the Vth of a cell is sensed as being higher than a target level of the target data state, the cell is inhibit from programming during subsequent program voltages of the programming operation.

For the verify operations, current sensing may be used for an all bit line architecture in which all cells are sensed concurrently. If the Vth of a cell is lower than the target level, the cell is in a conductive state during the verify operation and therefore consume a substantial amount of current. For multi-level operation (e.g., with 4, 8 16 or more data states), it is unnecessary to sense (or pre-charge) the bit lines of memory cells whose target data state is not match with the particular state currently being verified.

Current consumption can be reduced by avoiding unnecessary pre-charging of bit lines. One approach is to determine the memory cells for which bit line pre-charging is necessary before each verify operation. This can be done by reading latches associated with the memory cells to determine their target data state, and enabling a pre-charge only if the data state of the verify operation matches the target data state. Thus, the latches are read before each verify operation in the verify portion of a program-verify iteration. For example, if the data state of the verify operation is the A state, and a corresponding voltage is applied to the selected word line, a pre-charge is enabled only for memory cell with the A state as the target data state. The bit lines of the other memory cells are not pre-charged and remain at a level of a source line so that they do not consume current. This approach is advantageous because there is no unnecessary bit line pre-charging. However, this approach will have a longer programming time since, for every consecutive verify operation, a circuit needs to read the latches in a latch scan operation to determine which bit lines to pre-charge.

Another approach provides a shorter programming time but has increased power consumption because there is unnecessary bit line pre-charging. This approach only needs to read the latches once in the verify portion, e.g., at the beginning of the first verify operation. The latches identify the cells which are selected for programming (e.g., cells which are being programming in the current program-verify iteration) and the cells which are unselected for programming (e.g., cells which are in the erased state or cells which have previously completed programming). The unselected cells have a locked out status. No additional read of the latches is performed in the verify portion after the initial read. However, for each verify operation, the bit line pre-charging in unnecessary for a fraction of the cells, e.g., the cells for which the sensing result cells is not relevant and is discarded. For instance, when the verify operation for the A state is performed, bit line pre-charging occurs for A state cells, as is necessary, but also for B state cells, which is unnecessary.

An additional approach uses knowledge of the different phases of a programming operation to reduce the number of unnecessary bit line pre-charges. For example, during the lower program loop numbers of a programming operation, bit line pre-charging may occur for one or more lower data states but not for one or more higher data states. Similarly, during the higher program loop numbers, bit line pre-charging may occur for one or more higher data states but not for one or more lower data states. In another approach, which may or may not incorporate knowledge of the different phases of a programming operation, the latches may be read more than once but less than for every verify operation in the verify portion. In this way, the setting of the bit line pre-charge can be updated at least once after it is initially set in the verify portion. This results in a compromise between increased programming time and reduced power consumption.

Example memory devices in which the programming techniques can be used are discussed next.

FIG. 1 is a functional block diagram of a non-volatile memory device. The memory device 100 may include one or more memory die 108. The memory die 108 includes memory structure 126 of memory cells (e.g., including the blocks BLK0 and BLK1), control circuitry 110, and read/write circuits 128. The memory structure 126 is addressable by word lines via a row decoder 124 and by bit lines via a column decoder 132. The read/write circuits 128 include multiple sense blocks SB0, SB1, . . . , SBn−1 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via data bus 120 and between the controller and the one or more memory die 108 via lines 118.

The memory structure may comprise one or more arrays of memory cells including a two-dimensional or a three-dimensional array. The memory structure may comprise a monolithic three-dimensional memory array in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word lines, drain- and source-side select gate drivers (referring, e.g., to drain- and source-sides or ends of a string of memory cells such as a NAND string, for instance) and source lines. The sense blocks can include bit line drivers, in one approach.

In some implementations, some of the components can be combined. In various designs, one or more of the components (alone or in combination), other than memory structure 126, can be thought of as at least one control circuit or as control circuitry. For example, a control circuit may include any one of, or a combination of, control circuitry 110, state machine 112, decoders 114/132, power control module 116, sense blocks (SB0, including the processor 192 and managing circuit MC0 in FIG. 2C), read/write circuits 128, and controller 122, and so forth. The sense block SB0 is discussed further in connection with FIGS. 2A, 2C and 10A.

In another approach, a non-volatile memory system uses dual row/column decoders and read/write circuits. Access to the memory structure by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the memory structure 126. In this way, the density of the read/write modules is reduced by one half.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two-dimensional and three-dimensional exemplary structures described but covers all relevant memory structures within the spirit and scope of the technology as described herein and as understood by one of skill in the art.

FIG. 2A depicts a block of NAND strings in the memory structure 126 of FIG. 1 and associated sense blocks SB0, SB0a and SB0b. The memory structure can include many blocks. An example block 200 includes a number of NAND strings NS0 to NS11 and respective bit lines, e.g., BL0 to BL11, which are shared among the blocks. Each NAND string is connected at one end to a drain select gate (SGD) transistor, and the control gates of the SGD transistors are connected via a common SGD line. Each NAND string is connected at its other end to a source select gate (SGS) transistor which, in turn, is connected to a common source line 220. For example, NS0 includes a SGS transistor 202 and a SGD transistor 201. Example memory cells 208-219 are in N0 to NS11, respectively, and are connected to bit lines BL0-BL11, respectively. WL3 is a selected word line which is selected for programming and the example memory cells include selected memory cells which are selected for programming. See also FIG. 2B. Other memory cells connected to WL3 can also be selected memory cells. Sixty-four word lines, for example, WL0-WL63, extend between the source-side select gates and the drain-side select gates.

In one approach, one sense block is provided for a group of NAND strings, such as four NAND strings. For example, SB0 is associated with BL0-BL3, SB1 is associated with BL4-BL7 and SB2 is associated with BL8-BL11. Each sense block includes a memory controller, e.g., MC0, MC1 and MC2 in SB0, SB0a and SB0b, respectively. Each sense block also includes a sense module for each NAND string. Representative sense modules SM0, SM1 and SM2 are depicted in SB0, SB0a and SB0b, respectively. SB0 and MC0 are discussed further below.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. The cell is a charge-trapping memory cell. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge memory cells in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 2B:
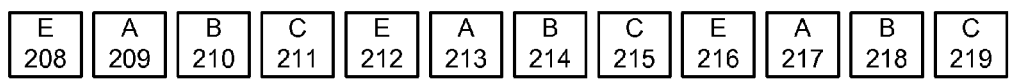
FIG. 2B depicts example data states of the memory cells 208-219 of FIG. 2A.

FIG. 2B depicts example data states of the memory cells 208-219 of FIG. 2A. The data states may be generally uniformly distributed among a set of memory cells. In this example, memory cells 208, 212 and 216 are in the erased state and are not to be programmed, memory cells 209, 213 and 217 have the A state as a target data state, memory cells 210, 214 and 218 have the B state as a target data state, and memory cells 211, 215 and 219 have the C state as a target data state.

Figure 2C:
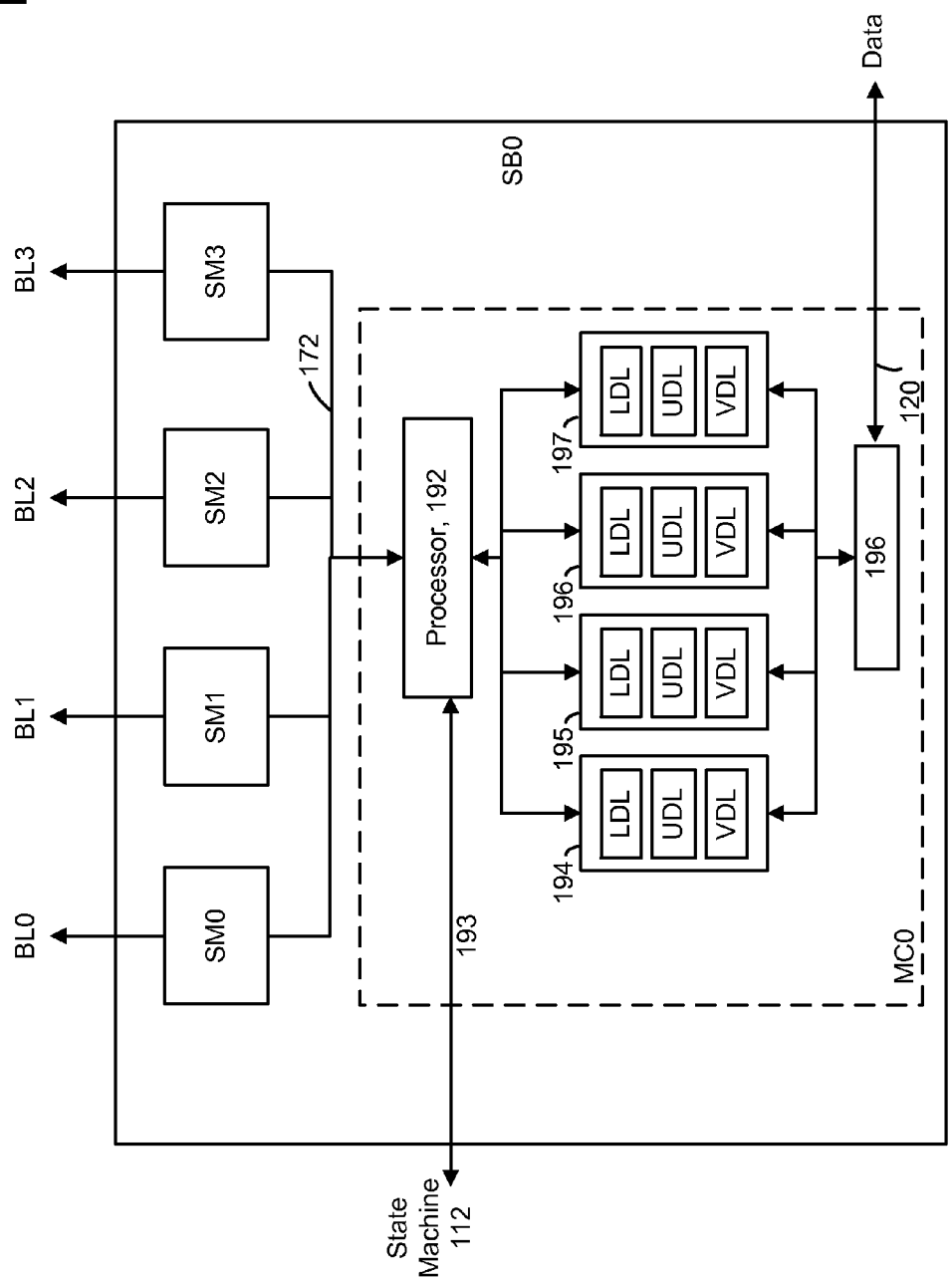
FIG. 2C is a block diagram depicting one embodiment of the sense block SB0 of FIG. 1.

FIG. 2C is a block diagram depicting one embodiment of the sense block SB0 of FIG. 1. The individual sense block SB0 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of multiple, e.g., four or eight, sense modules. Each of the sense modules in a group communicates with the associated managing circuit via a data bus 172. Thus, there are one or more managing circuits which communicate with the sense modules of a set of memory cells.

Figure 10A:
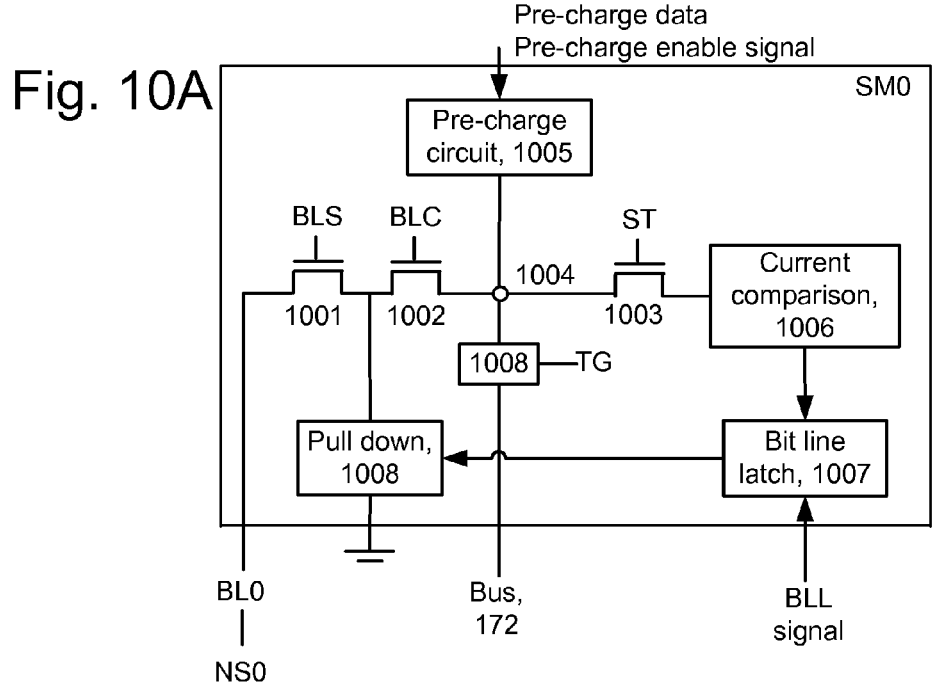
FIG. 10A depicts an example implementation of the sense module SM0 of FIG. 2C, consistent with FIGS. 7A and 7B.

Referring also to FIG. 10A, the sense module SM0 comprises sense circuitry that performs sensing by determining whether a conduction current in a connected bit line is above or below a predetermined threshold level. SM0 includes a bit line latch 1007 that is used to set a voltage condition on the connected bit line. For example, a predetermined state latched in the bit line latch will result in the connected bit line being pulled to a state designating program inhibit (e.g., 1.5-3 V). As an example, a value flag=0 can be set to inhibit programming (status=lockout), while flag=1 allows programming (status=program).

Managing circuit MC0 comprises a processor 192, four example sets of data latches 194-197 and an I/O interface 196 coupled between the sets of data latches and a data bus 120. One set of data latches can be provide for each sense module, and data latches identified by LP, UP and QPW1 may be provided for each set. In some cases, additional data latches may be used. In other cases, fewer data latches may be used. LP stores a bit for a lower page of data, and UP stores a bit for an upper page of data. This is in a four-level or two-bits per memory cells memory device. In each set of latches, one or more additional data latches, each storing one bit of data, can be provided to maintain a count of program voltages which are applied to a memory cell when its Vth is between the lower and higher verify levels, e.g., when the memory cell experiences slow programming.

Processor 192 performs computations, such as to determine the data stored in the sensed memory cells and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120. The processor may also set pre-charge data for the sense modules.

During verify operations, the operation of the system is under the control of the state machine 112 that controls the supply of different control gate voltages to the addressed memory cells. As it steps through the various predefined control gate voltages corresponding to the various target data states supported by the memory, the sense module may trip at one of these voltages and a corresponding output will be provided from sense module to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit MC0, bit line latch 1007 serves double duty, both as a latch for latching the output of the sense module and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine reads the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120. The programming operation, under the control of the state machine, comprises a series of program voltage pulses applied to the control gates of the addressed memory cell. Each program voltage is followed by a read back (verify) to determine if the memory cell has been programmed to the desired memory state. In some cases, processor 192 monitors the read back memory state relative to the desired memory state. When the two states agree, the processor 192 sets the bit line latch 1007 to cause the bit line to be pulled to a state designating program inhibit. This inhibits the memory cell coupled to the bit line from further programming even if program voltages appear on its control gate. In other embodiments, the processor initially loads the bit line latch 1007 and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 6A:
FIG. 6A to 6D depict a three-pass programming operation in which lower, middle and upper pages of data are written in first, second and third passes, respectively.
Figure 6B:
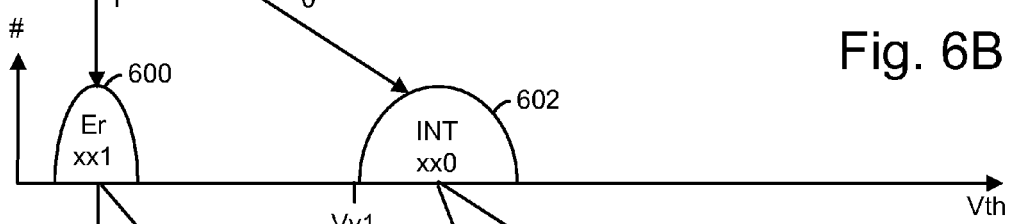
Figure 6C:
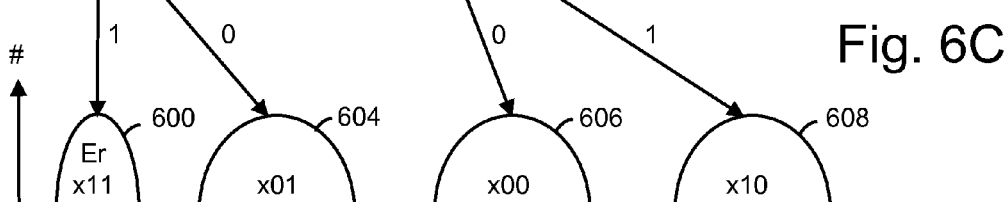

The data latches identify when an associated memory cell has reached certain mileposts in a programming operation. For example, latches may identify that the Vth of a memory cell is below a particular verify level. The data latches indicate whether a memory cell currently stores one or more bits from a page of data. When lower and upper page bits are used (e.g., in case of two-bits per memory cell), the LP latches can be used to store a lower page of data and are flipped (e.g., from 0 to 1) when a lower page bit is stored in an associated memory cell. The UP latches can be used to store an upper page of data and are flipped when an upper page bit is stored in an associated memory cell. The flipping of a bit occurs when an associated memory cell completes programming, e.g., when its Vth exceeds a target or lockout verify level, Vv. When lower, middle and upper page bits are used (e.g., in case of three-bits per memory cell), MP (middle page) latches are also used. MP is flipped when a middle page bit is stored in an associated memory cell. For example, in FIG. 6B to 6D, the first bit (from right to left) is the lower page bit, the second bit is the middle page bit and the third bit is the upper page bit.

FIG. 3A depicts a cross-sectional view of a portion of a NAND string of FIG. 2A in an example three-dimensional memory device. In an example embodiment, the NAND string 236 is provided in a stacked three-dimensional non-volatile memory device which includes alternating conductive and insulating layers in which select gates and memory cells are formed. The NAND string extends between a SGD select gate at one end and an SGS select gate at the opposite end. A drain end of the NAND string is in communication with a bit line, and a source end of the NAND string is in communication with a source line. The NAND string comprises a column which includes a number of layers which are deposited along the sidewalls of the column. These layers can include oxide-nitride-oxide and polysilicon layers which are deposited, e.g., using atomic layer deposition. For example, a block oxide (BOX) can be deposited as layer 296, a nitride such as SiN as a charge-trapping layer (CTL) can be deposited as layer 297, a tunnel oxide (TNL) can be deposited as layer 298, a polysilicon body or channel (CH) can be deposited as layer 299, and a core filler dielectric can be deposited as region 300.

When a memory cell is programmed, electrons are stored in a portion of the CTL which is associated with the memory cell. For example, electrons are represented by "-" symbols in the CTL 297. These electrons are drawn into the CTL from the channel, and through the TNL, as indicated by the arrows. The threshold voltage of a memory cell is increased in proportion to the amount of stored charge.

The view depicted includes five layers of the stack including dielectric layers D2, D3 and D4, and conductive word line layers WLL2 and WLL3. The view further includes example memory cells M02, M12, M03 and M13. The view also shows portions D4D and D4S of the dielectric layer D4, portions D3D and D3S of the dielectric layer D3, and portions D2D and D2S of the dielectric layer D22. The view also shows portions WLL4D and WLL4S of the conductive layer WLL4, portions WLL3D and WLL3S of the conductive layer WLL3, and portions WLL2D and WLL2S of the conductive layer WLL2.

A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 297 such as SiN or other nitride, a tunnel oxide (TNL) 298, a polysilicon body or channel (CH) 299, and a core filler dielectric 300. The word line layer includes a block oxide (BOX) 296, a block high-k material 295, a barrier metal 294, and a conductive metal such as W 293. In another approach, all of these layers except the W are provided in the column. Additional memory cells are similarly formed throughout the columns.

FIG. 3B depicts a cross-sectional view along line 302 of FIG. 3A. Each layer is ring-shaped in one possible approach, except the core filler, which is a cylinder.

FIG. 3C depicts an example circuit in a three-dimensional memory device which includes the NAND string of FIG. 3A. NAND strings NS0, NS1, NS2 and NS3 are in communication with a bit line BL0 (one bit line) in BL-SB0 (a bit line sub-block), and NAND strings NS0A, NS1A, NS2A and NS3A are in communication with a bit line BL1 (another bit line) in BL-SB1 (another bit line sub-block). The filled in circles indicate control gates of the SG transistor and the memory cells on the drain side of a NAND string. The open circles indicate control gates of the SG transistor and the memory cells on the source side of a NAND string.

For example, NS0 has a drain side comprising memory cells M00, M01, M02 and M03 and an SGD transistor SGD0, and a source side comprising memory cells M10, M11, M12 and M13 and an SGS transistor SGS0. NS1 has a drain side comprising memory cells M30, M31, M32 and M33 and an SGD transistor SGD1, and a source side comprising memory cells M20, M21, M22 and M23 and an SGS transistor SGS1. NS2 has a drain side comprising memory cells M40, M41, M42 and M43 and an SGD transistor SGD2, and a source side comprising memory cells M50, M51, M52 and M53 and an SGS transistor SGS2. NS3 has a drain side comprising memory cells M70, M71, M72 and M73 and an SGD transistor SGD3, and a source side comprising memory cells M60, M61, M62 and M63 and an SGS transistor SGS3.

Similarly, NS0A has a drain side comprising memory cells M00A, M01A, M02A and M03A and an SGD transistor SGD0A, and a source side comprising memory cells M10A, M11A, M12A and M13A and an SGS transistor SGS0A. NS1A has a drain side comprising memory cells M30A, M31A, M32A and M33A and an SGD transistor SGD1A, and a source side comprising memory cells M20A, M21A, M22A and M23A and an SGS transistor SGS1A. NS2A has a drain side comprising memory cells M40A, M41A, M42A and M43A and an SGD transistor SGD2A, and a source side comprising memory cells M50A, M51A, M52A and M53A and an SGS transistor SGS2A. NS3A has a drain side comprising memory cells M70A, M71A, M72A and M73A and an SGD transistor SGD3A, and a source side comprising memory cells M60A, M61A, M62A and M63A and an SGS transistor SGS3A.

Each NAND string has a back gate (BG0 for NS0, BG1 for NS1, BG2 for NS2, BG3 for NS3, BG0A for NS0A, BG1A for NS1A, BG2A for NS2A, BG3A for NS3A). The control gates of all of the back gates in the circuit 303 may be connected to one another.

In one approach, the source side of each SGS transistor is connected to a common source line of the circuit 303

At each level of the circuit 303, the control gates of the drain-side memory cells are connected to one another by a common word line layer. For example, M03, M03A, M33, M33A, M43, M43A, M73 and M73A have control gates connected by the word line layer WLthree-dimensional, consistent with FIG. 3B. M13, M13A, M23, M23A, M53, M53A, M63 and M63A have control gates connected by the word line layer WL3S.

M02, M02A, M32, M32A, M42, M42A, M72 and M72A have control gates connected by the word line layer WL2D. M12, M12A, M22, M22A, M52, M52A, M62 and M62A have control gates connected by the word line layer WL2S.

M01, M01A, M31, M31A, M41, M41A, M71 and M71A have control gates connected by the word line layer WL1D. M11, M11A, M21, M21A, M51, M51A, M61 and M61A have control gates connected by the word line layer WL1S.

M00, M00A, M30, M30A, M40, M40A, M70 and M70A have control gates connected by the word line layer WL0D. M10, M10A, M20, M20A, M50, M50A, M60 and M60A have control gates connected by the word line layer WL0S.

Additionally, control gates of the SGD transistors are connected to one another in respective SGD line subsets. For example, control gates of SGD0 and SGD0A are connected, control gates of SGD1 and SGD1A are connected, control gates of SGD2 and SGD2A are connected, and control gates of SGD3 and SGD3A are connected.

The control gates of the SGS transistors are connected to one another in the x-direction. For example, control gates of SGS0 and SGS0A are connected, control gates of SGS1 and SGS1A are connected, control gates of SGS2 and SGS2A are connected, and control gates of SGS3 and SGS3A are connected. In a programming operation, the memory cells can be programmed in different ways. In one approach, the memory cells in a bit line subset (or multiple bit line subsets) can be programmed in a common programming operation. Similarly, the SG transistors can be programmed individually or concurrently in an SGD line subset.

Figure 4A:
FIGS. 4A and 4B depict an example one-pass programming operation in which lower and upper pages of data are written concurrently.
Figure 4B:
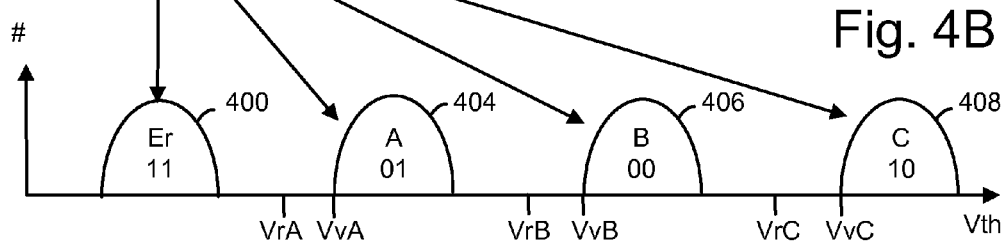

FIGS. 4A and 4B depict an example one-pass programming operation in which lower and upper pages of data are written concurrently. A programming pass, or programming operation, is generally meant to encompass a sequence of program-verify iterations which are performed until the threshold voltages of a set of selected memory cells reach one or more respective verify levels of respective target data states. Some of the memory cells are not programmed and remain in the erased state while others are programmed to higher target data states.

Example Vth distributions are provided for a case where each memory cell stores two bits of data. Each graph depicts Vth on the x-axis and a number or population of memory cells in a Vth distribution on the y-axis. One bit represents the LP data and the other bit represents the UP data. For example, 11 denotes UP=1 and LP=1, 01 denotes UP=0 and LP=1, 00 denotes UP=0 and LP=0 and 10 denotes UP=1 and LP=0. A first Vth distribution 400 is provided for erased (Er) state memory cells. Vth distributions 404, 406 and 408 represent target data states A, B and C, respectively, which are reached by memory cells when their Vth exceeds a verify level VvA, VvB or VvC, respectively.

Read reference voltages VrA, VrB and VrC which are between the distributions are used for reading data from the memory cells. By testing whether the Vth of a given memory cell is above or below one or more of the read reference voltages, the system can determine the data state which is represented by a memory cell.

Figure 5A:
FIG. 5A to 5C depict a two-pass programming operation in which lower and upper pages of data are written in first and second passes, respectively.
Figure 5B:
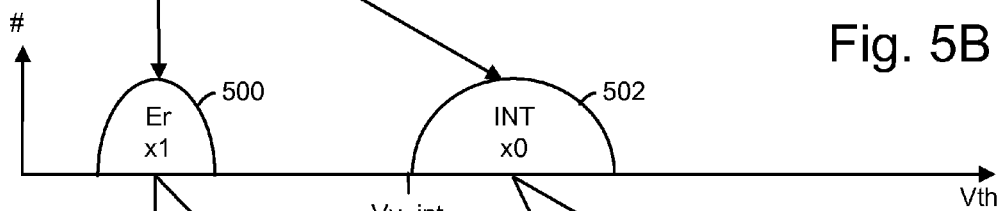
Figure 5C:
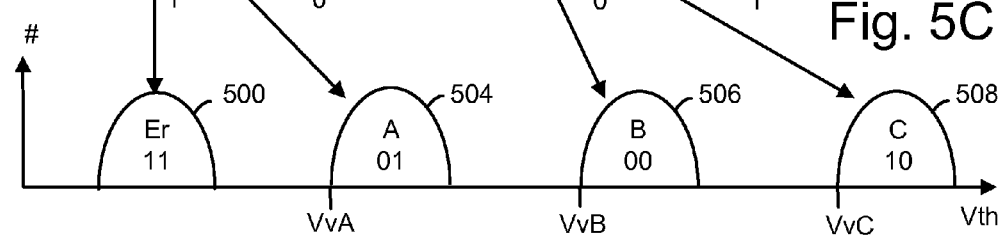

FIG. 5A to 5C depict a two-pass programming operation in which lower and upper pages of data are written in first and second passes, respectively, using two-bit, four-level memory cells. Programming can be performed one logical page at a time, with the lower page followed by the upper page. Initially, all memory cells are in the Er state, represented by the distribution 500 in FIG. 5A.

FIG. 5B depicts programming of a lower page of data. If the lower page has a bit=1, the associated memory cell remains in the distribution 500 and the data is represented by x1, where x is an upper page bit that is not yet known. If the lower page has a bit=0, the memory cell is programmed to a higher Vth as represented by distribution 502, which is an interim distribution (INT), using a verify level Vv_int. The data of these memory cells is represented by x0. The interim distribution can be relatively wide since it is does not represent a data state.

FIG. 5C depicts programming of an upper page of data. If UP/LP=11, the associated memory cell in the distribution 500 remains in the distribution 500 and stores data bits 11. If UP/LP=01, the memory cells in the distribution 500 are programmed to the distribution 504 (state A). If UP/LP=10, the memory cells in the distribution 502 are programmed to the distribution 508 (state C). If UP/LP=00, the memory cells in the distribution 502 are programmed to the distribution 506 (state B). Optionally, a slow programming mode is used when the Vth is within a margin of the verify level of the target data state.

Programming can be similarly extended to three or more bits per memory cell. For example, FIG. 6A to 6D depict a three-pass programming operation in which lower, middle and upper pages of data are written in first, second and third passes, respectively.

Programming of lower, middle and upper pages in three-bit, eight-level memory cells is depicted. Seven programmed data states A through G are used in addition to Er for eight states total. Initially, all memory cells are in the Er state, represented by the distribution 600. The lower page is programmed in FIG. 6B. If LP=1, memory cells in distribution 600 remain in that distribution. If LP=0, memory cells in distribution 600 are programmed to an interim distribution 602 using Vv1. The middle page is programmed in FIG. 6C. If MP=1, memory cells in distribution 600 remain in that distribution, and memory cells in distribution 602 are programmed to interim distribution 608 using verify level Vv4. If MP=0, memory cells in distribution 600 are programmed to interim distribution 604 using verify level Vv2, and memory cells in distribution 602 are programmed to interim distribution 606 using verify level Vv3.

Figure 6D:
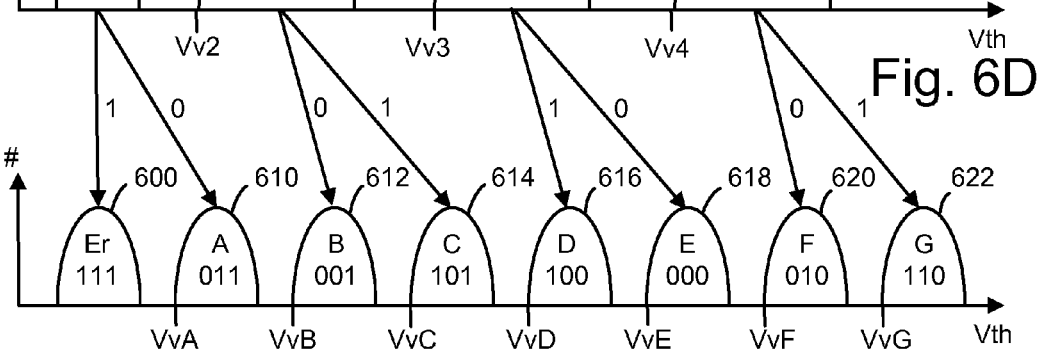

The upper page is programmed in FIG. 6D. QPW is used for this pass. If UP=1, memory cells in distribution 600 remain in that distribution, memory cells in distribution 604 are programmed to distribution 614 (state C), memory cells in distribution 606 are programmed to distribution 616 (state D), and memory cells in distribution 608 are programmed to distribution 622 (state G). If UP=0, memory cells in distribution 600 are programmed to distribution 610 (state A), memory cells in distribution 604 are programmed to distribution 612 (state B), memory cells in distribution 606 are programmed to distribution 618 (state E), and memory cells in distribution 608 are programmed to distribution 620 (state F).

Programming using four bits per cell (16 levels) can similarly involve four pages. Additionally, when programming multiple pages of data, a back and forth word line order may be used to reduce potential disturbs from capacitive coupling.

FIG. 7A depicts an example process in which sensing, including pre-charging of bit lines, occurs according to a current phase of a multi-phase programming operation. Step 700 starts the beginning phase of a programming operation. Step 701 involves identifying a number NS of selected target data states and a number NU of unselected target data states for the phase. NS is an integer number of one or more and can vary for each phase. NU is an integer number of zero or more and can vary for each phase. NS+NU=the total number of target data states, e.g., 3 for a 4-state memory, 7 for an 8-state memory or 15 for a 16-state memory. In some phases, NS is a number >=2 and NU is a number >=1. The NS selected target data states and the NU unselected target data states are a function of the current phase of the programming operation.

Step 702 performs a program portion of a program-verify iteration, such as by applying a program voltage to a set of memory cells via a selected word line. Step 703 performs a verify portion of the program-verify iteration. This includes, applying a number of verify voltages in turn to the selected word line. For each verify voltage, sensing, including pre-charging of bit lines, is performed for memory cells with the selected target data states but not for the memory cells with the unselected target data states or for locked out memory cells. The sensing of each target data state is a verify operation. Decision step 704 determines if there is a next phase of the programming operation. If there is a next phase, different selected target data states and unselected target data states are identified at step 701.

If there is not a next phase, decision step 705 determines if there is a next program-verify iteration. If there is a next program-verify iteration, step 702 is performed. If there is not a next program-verify iteration, the programming operation ends at step 706.

Figure 7B:
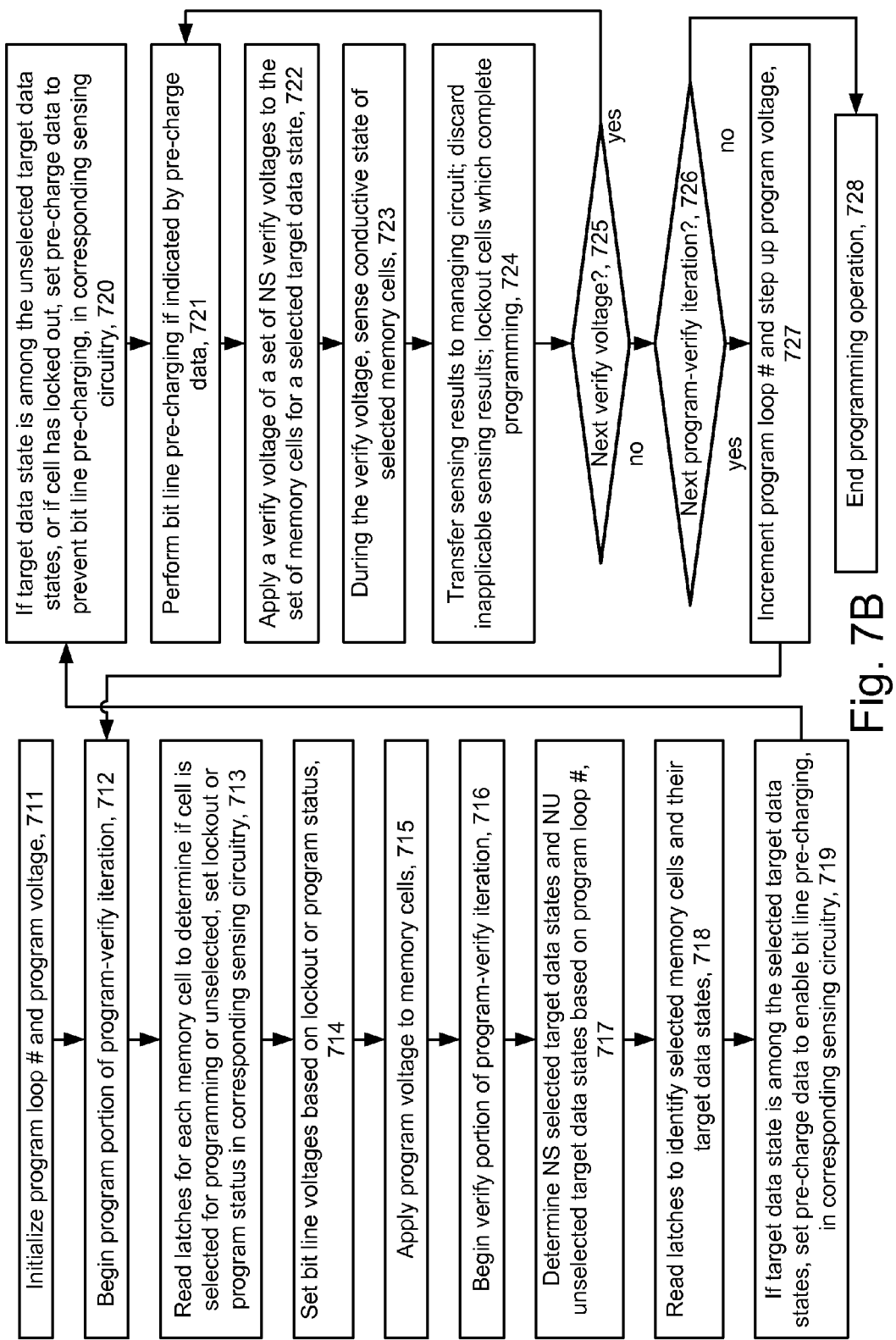
FIG. 7B depicts an example detailed implementation of the process of FIG. 7A.

FIG. 7B depicts an example detailed implementation of the process of FIG. 7A. In this example, bit line pre-charge data is set one time during the verify portion. However, other approaches are possible. See, e.g., FIG. 9A-9F. Step 711 involves initializing a program loop # and a program voltage (Vpgm). The program loop number can represent a sequential position of a program-verify iteration in a programming operation, e.g., first second and so forth. For example, the initial value can be one. The program portion of the program-verify iteration begins at step 712. Step 713 involves reading a set of latches for each memory cell to determine if a cell is selected for programming or unselected, and setting a lockout or program status in corresponding sensing circuitry. For example, this status could be set in a bit line latch. A program status is set for a selected memory cell and a lockout status is set for an unselected memory cell. Step 714 involves setting the bit line voltages (Vbl) based on the lockout or program status. For example, Vbl=0 V for the cells with a program status and Vbl=inhibit (e.g., 2-3 V) for a cell with a lockout status. Step 715 involves applying the program voltage to the memory cells, e.g., via a selected word line.

Step 716 begins the verify portion of the program-verify iteration. Step 717 determines a number NS of selected target data states and a number NU of unselected target data states based on the program loop #. For example, a number of lower states may be selected during the lower program loop numbers, and a number of higher states may be selected during the higher program loop numbers. Or, a number of lower states may be selected during the lower program loop numbers, and all states may be selected during the higher program loop numbers. Other options are possible as well.

For a given program loop, the selected target data states are the states which are likely to complete programming during the program loop. This approach reduces the number of sensing operations by avoiding sensing of memory cells which are unlikely to complete programming during the program loop.

Step 718 involves reading sets of latches to identify selected memory cells and their target data states. At step 719, if a target data state for a cell is among the selected target data states, pre-charge data is set to enable bit line pre-charging in corresponding sensing circuitry for the cell. At step 720, if a target data state for a cell is among the unselected target data states, or if a cell has locked out, pre-charge data is set to prevent bit line pre-charging in corresponding sensing circuitry for the cell. The pre-charge data is maintained throughout the verify portion unless it is set again.

Step 721 involves performing bit line pre-charging if indicated by the pre-charge data in the sensing circuitry. Step 722 involves applying a verify voltage of a set of NS verify voltages to the set of memory cells for a selected target data state. For example, VvA or VvB can be applied for the A or B state, respectively. Step 723 involves, during the verify voltage, sensing a conductive state of the selected memory cells. For example, this can include all selected memory cells regardless of whether they have the target data state which is associated with the verify voltage.

For example, assume A and B are the selected target data states and C is the unselected target data state. Thus, when VvA is applied, all of the selected (not locked out) cells with the A and B state are sensed. Any locked out cells with the A and B state are not sensed, and any cells with the Er or C state are not sensed. Power is saved by not sensing the cells with the Er or C state or the locked out cells with the A and B states since a bit line pre-charge is avoided. Similarly, when VvB is applied, all of the selected cells with the A and B state are sensed. Any locked out cells with the A and B state are not sensed, and any cells with the C state are not sensed.

Step 724 involves transferring the sensing results to a managing circuit, discarding inapplicable sensing results (e.g., results for cells which do not have the target data state which is associated with the verify voltage), and locking out cells which complete programming. For example, sensing results obtained when VvA is applied are applicable to A state cells and inapplicable to B state cells, and sensing results obtained when VvB is applied to B state cells and inapplicable to A state cells.

Decision step 725 determines if there is a next verify voltage in the program-verify iteration. If there is a next verify voltage, step 721 is performed. If there is not a next verify voltage, decision step 726 is reached. Decision step 726 determines if there is a next program-verify iteration. If there is a next program-verify iteration, step 727 increments the program loop # and steps up the program voltage, after which step 712 is performed. If there is not a next program-verify iteration, the programming operation ends at step 728.

Figure 8:
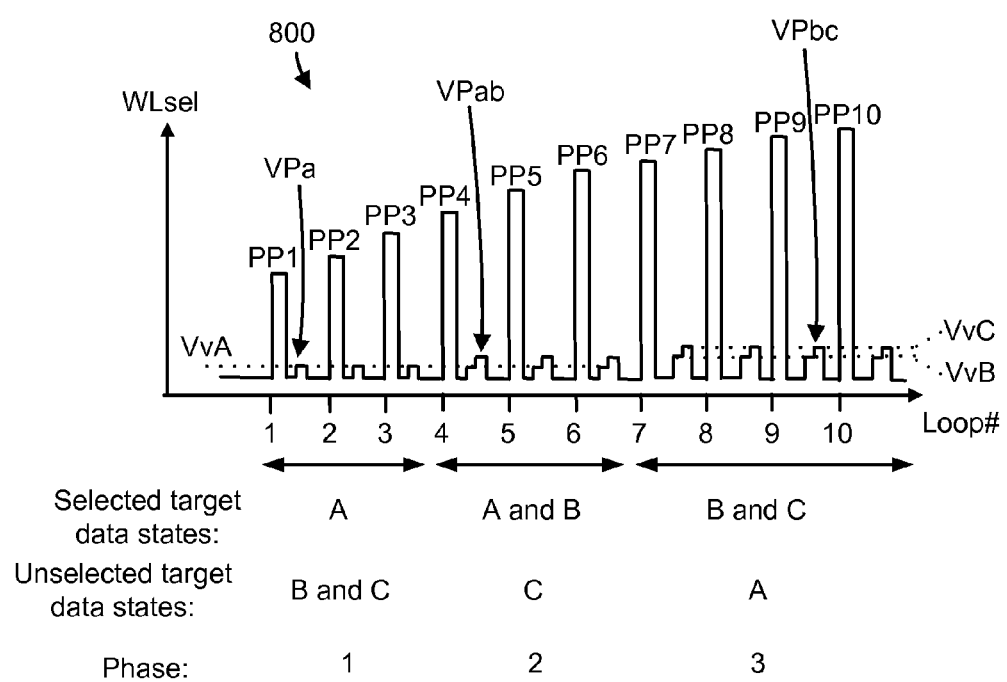
FIG. 8 depicts one example of different phases of a one-pass programming operation such as depicted in FIGS. 4A and 4B and consistent with FIGS. 7A and 7B.

FIG. 8 depicts one example of different phases of a one-pass programming operation such as depicted in FIGS. 4A and 4B and consistent with FIGS. 7A and 7B. Alternatively, the phases can be provided in in the second pass of a two-pass programming operation such as depicted in FIG. 5A to 5C, or more generally in any phase of a multi-phase programming operation. The horizontal axis depicts program loop number, and the vertical axis depicts control gate or word line voltage on WLsel, the selected word line. Generally, a programming operation includes successive program-verify iterations. Each program-verify iteration has a program portion in which a program voltage (PP) is applied to the control gates of the memory cells via a selected word line, followed by a verify portion in which one or more verify voltages (VP) are applied to the control gates of the memory cells while at least some of the memory cells are sensed.

The voltage waveform 800 depicts a series of program voltages PP1 to PP10 and verify voltages. One or two verify voltages are provided after each program voltage, as an example, based on the programming phase and the corresponding target data states which are being verified. 0 V may be applied to the selected word line between the program and verify voltages. For example, in a first programming phase which involves loops 1-3, the A state is the selected target data state and the B and C states are the unselected target data states. In this phase, an A-state verify voltage (e.g., VPa) at a level of VvA is applied during the verify portion. In a second programming phase which involves loops 4-6, the A and B states are the selected target data states and the C state is the unselected target data state. In this phase, A- and B-state verify voltages (e.g., VPab) at levels of VvA and VvB, respectively, are applied during the verify portion. In a third programming phase which involves loops 7-10, the B and C states are the selected target data states and the A state is the unselected target data state. In this phase, B- and C-state verify voltages (e.g., VPbc) at levels of VvB and VvC, respectively, are applied during the verify portion.

In another example of different phases of a one-pass programming operation, in the third programming phase which involves loops 7-10, the A, B and C states are the selected target data states and there is no unselected target data state. In this phase, A-, B- and C-state verify voltages at levels of VvA, VvB and VvC, respectively, are applied during the verify portion.

Various other approaches are possible as well. For example, in an eight state memory system in which the target data states are A-G, several phases are possible. For instance, five phases may be used which include these groups of states: ABC, BCD, CDE, DEF and EFG. Another example is: ABCD, CDEF and EFG. Many other examples are possible.

The program loop numbers which define the phases can be predetermined or determined adaptively during the programming operation based on a programming progress of the set of memory cells. For example, the second phase may begin when a specified potion of the A state memory cells have completed programming, e.g., 50%, and the third phase may begin when a specified potion of the B state memory cells have completed programming, e.g., 50%.

Figure 9A:
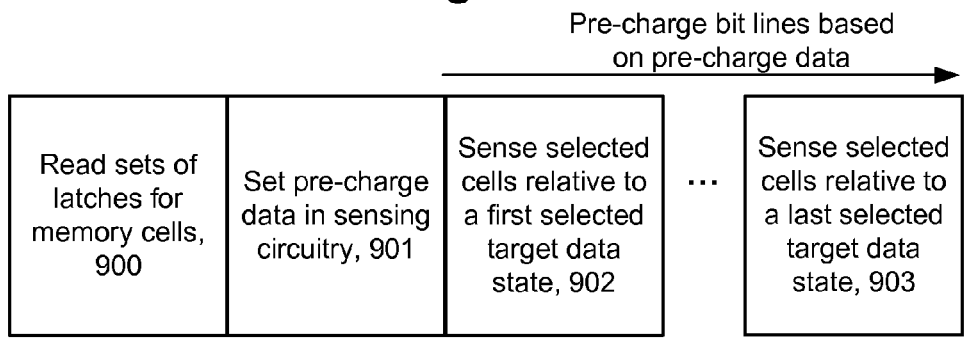
FIG. 9A depicts a sequence for setting pre-charge data in a verify portion of a program-verify iteration, consistent with FIGS. 7A and 7B, where pre-charge data is set once.

FIG. 9A depicts a sequence for setting pre-charge data in a verify portion of a program-verify iteration, consistent with FIGS. 7A and 7B, where pre-charge data is set once for a verify portion. Here, there is one read of the sets of latches (such as the latches 194-197 in FIG. 2C) of the memory cells (step 900). In the example of FIG. 2C, there are four associated memory cells for each processor. Each of the processors can read the associated sets of latches to identify the target data states of the associated selected memory cells. Note that the read of the set of latches can occur during the program portion or at a start of the verify portion of the program-verify iteration.

Each set of latches store a bit combination for an associated memory cell. A bit combination can identify a target data state for an associated memory cell which is selected for programming (e.g., a memory cell which is not locked out from programming). For example, referring to FIG. 4B, the bit combinations 01, 00 and 10 identify the A, B and C states. A bit combination (e.g., 11) can alternatively identify a memory cell which is unselected for programming (e.g., a memory cell which is locked out from programming). Based on the read and a current phase of the programming, pre-charge data is set by the processor in sensing circuitry of the memory cells (step 901). The current programming phase indicates one or more selected target data states. The pre-charge data indicates, for each memory cell, whether the bit line should be pre-charged during each sensing operation of the verify portion. The pre-charge data is set to enable bit line pre-charging for a selected memory cell for which the target data state is a selected target data state in the current programming phase. The pre-charge data is set to disable bit line pre-charging for a selected memory cell for which the target data state is an unselected target data state in the current programming phase. The pre-charge data is also set to disable bit line pre-charging for an unselected memory cell.

For example, assume the selected target data states of the current programming phase are the A and B states, as in phase 2 of FIG. 8. Thus, the verify portion involves applying VvA and VvB in turn to a selected word line to sense memory cells relative to the A and B state, respectively. The bit line will be pre-charged during both VvA and VvB for the cells which have the A or B state as a target data state. For example, step 902 involves sensing the selected cells relative to a first selected target data state of the selected target data states of the current programming phase, e.g., the A state, and step 903 involves sensing the selected cells relative to a last selected target data state of the selected target data states of the current programming phase, e.g., the B state.

An advantage of this approach is that time is saved in the verify portion by reading the sets of latches only once to set the pre-charge data for the verify portion, and maintaining the pre-charge data in the sensing circuitry based on that read for the entire verify portion. Additionally, power is saved by avoiding pre-charging of a bit line for a memory cell having an unselected target data in the current programming phase.

A disadvantage is that power is consumed in pre-charging a bit line for a memory cell when the target data state is different than the state which is being sensed. That is, power is consumed in pre-charging a bit line for a memory cell with the A state as the target data state when VvB is applied and the verification is relative to the B state. This is a wasted bit line pre-charge because it is used to obtain a sensing result which is not relevant. That is, the sensing circuitry is activated to determine whether a cell is in a conductive state when a verify voltage is applied to the cell, but the data state associated with the verify voltage does not match the target data state of the cell. There is a mismatch between the verify voltage and the target data state of the cell. In contrast, a bit line pre-charge is not wasted when there is a match between the verify voltage and the target data state of the cell. Similarly, power is consumed in pre-charging a bit line for a memory cell with the B state as the target data state when VvA is applied and the verification is relative to the A state. This is also a wasted bit line pre-charge.

Assume there is a number K of selected target data states which are verified in the verify portion, excluding the erased state, and that the target data states are distributed uniformly among the memory cells. The, for each of the K verify voltages 1/K of the bit line pre-charges are not wasted and (K−1)/K of the bit line pre-charges are wasted. In the above example, K=2.

Figure 9B:
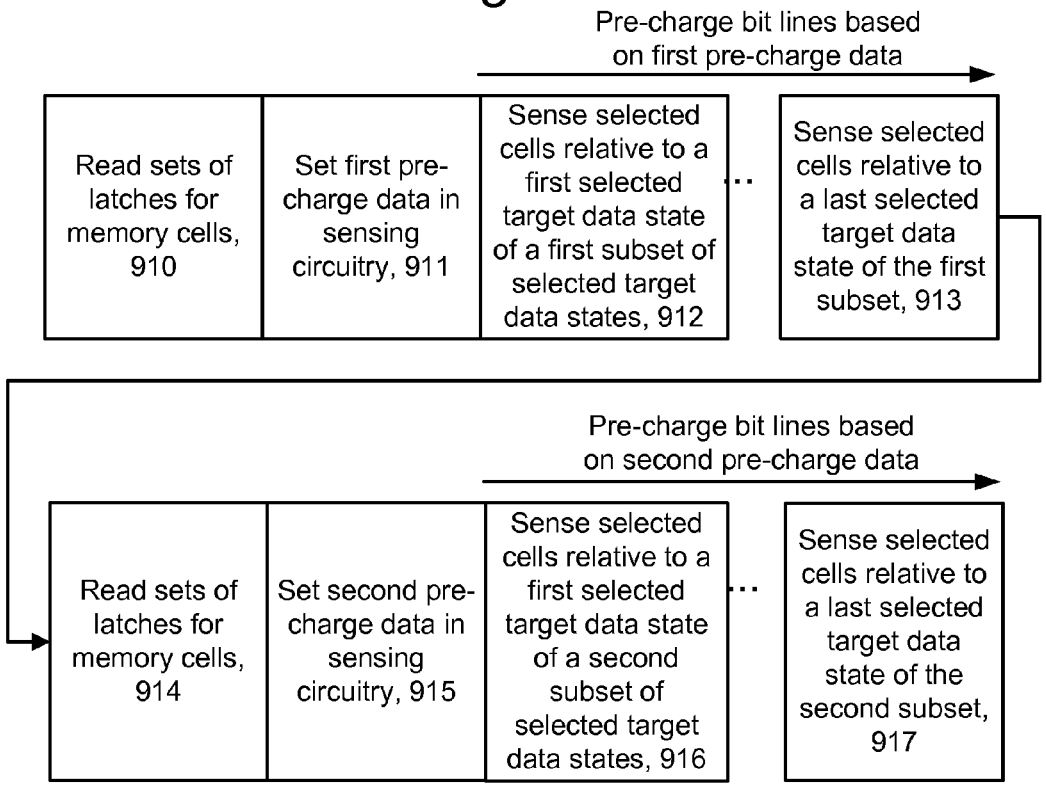
FIG. 9B depicts a sequence for setting pre-charge data in a verify portion of a program-verify iteration, consistent with FIGS. 7A and 7B, where pre-charge data is set twice.

FIG. 9B depicts a sequence for setting pre-charge data in a verify portion of a program-verify iteration, consistent with FIGS. 7A and 7B, where pre-charge data is set twice. Power consumption can be reduced by reading the sets of latches and setting the pre-charge data multiple times during the verify portion, at the expense of increased read time. The pre-charge data is maintained in the sensing circuitry during one or more verify voltages of the verify portion. This approach reduces the number of wasted bit line pre-charges because it reduces the number of bit line pre-charges when there is a mismatch between the verify voltage and the target data state of the cell. Instead, the pre-charge data can be set differently for different subsets of verify voltages in the verify portion. Moreover, this approach can work regardless of whether the selected target data states are changed based on the programming phase. This approach is particular suited to programming which involves four, eight or more data states. For example, with seven target data states of A-G, as in FIG. 6D, assume A-D are in a first subset of selected target data states and E-G are in a second subset of selected target data states.

Step 910 involves a first reading of the sets of latches for the memory cells. This involves identifying selected memory cells whose target data state is in the first subset of selected target data states. Step 911 involves setting first pre-charge data in the sensing circuitry, e.g., to enable bit line pre-charging for a selected memory cell whose target data state is in the first subset of selected target data states (states A-D), to disable bit line pre-charging for a selected memory cell whose target data state in the second subset of selected target data states (states E-G), and to disable bit line pre-charging for an unselected memory cell. Step 912 involves sensing the selected cells relative to a first selected target data state (e.g., the A state) of the first subset of selected target data states. A subsequent step involves sensing the selected cells relative to a second selected target data state (e.g., the B state) of the first subset of selected target data states. Subsequent steps proceed accordingly until step 913 which involves sensing the selected cells relative to a last selected target data state (e.g., the D state) of the first subset of selected target data states.

Step 914 involves a second reading of the sets of latches for the memory cells. This involves identifying selected memory cell whose target data state is in the second subset of selected target data states. Step 915 involves setting second pre-charge data in the sensing circuitry, e.g., to enable bit line pre-charging for a selected memory cell whose target data state is in the second subset of selected target data states, to disable bit line pre-charging for a selected memory cell whose target data state in the first subset of selected target data states, and to disable bit line pre-charging for an unselected memory cell. Step 916 involves sensing the selected cells relative to a first selected target data state (e.g., the E state) of the second subset of selected target data states. A subsequent step involves sensing the selected cells relative to a second selected target data state (e.g., the F state) of the second subset of selected target data states. Step 917 which involves sensing the selected cells relative to a last selected target data state (e.g., the G state) of the second subset of selected target data states.

Figure 9C:
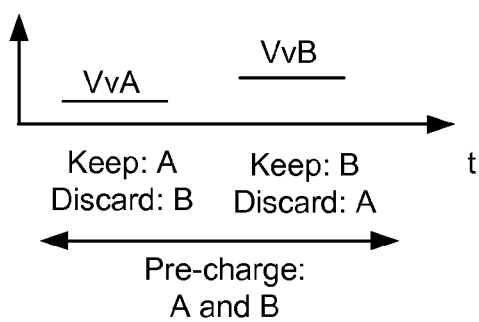
FIG. 9C depicts a verify sequence corresponding to FIG. 9A, in which knowledge of a programming phase is used to reduce unnecessary bit line pre-charging.

FIG. 9C depicts a verify sequence corresponding to FIG. 9A, in which knowledge of a programming phase is used to reduce unnecessary bit line pre-charging. Time is on the horizontal axis and WLsel is on the vertical axis. When VvA is applied, sensing results are kept for A state cells and discarded for B state cells. When VvB is applied, sensing results are kept for B state cells and discarded for A state cells. A discarded sensing results corresponds to a wasted bit line pre-charge. The A and B state cells are both pre-charged during VvA and VvB.

Figure 9D:
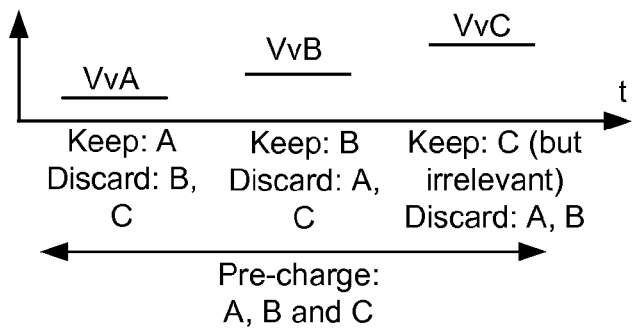
FIG. 9D is a verify sequence which is an alternative to FIG. 9, in which knowledge of a programming phase is not used to reduce unnecessary bit line pre-charging.

FIG. 9D is a verify sequence which is an alternative to FIG. 9, in which knowledge of a programming phase is not used to reduce unnecessary bit line pre-charging. In this example, there are no unselected target data states, so that bit line pre-charging occurs for cells of all target data states. Pre-charge data is used while verifying states A-C. Time is on the horizontal axis and WLsel is on the vertical axis. When VvA is applied, sensing results are kept for A state cells and discarded for B and C state cells. When VvB is applied, sensing results are kept for B state cells and discarded for A and C state cells. When VvC is applied, sensing results are kept for C state cells and discarded for A and B state cells. The A-C state cells are pre-charged during VvA-VvC. However, the sensing results from the C state cells may be irrelevant if the current program loop is early in the programming operation (e.g., loop#1-6 in FIG. 8) in which case no C state cells have reached the C state.

In the sequence of FIG. 9D, the number of wasted bit line pre-charges is proportional to the number of discarded states per verify voltage (2) and the number of verify voltages (3), or 6. In contrast, in the sequence of FIG. 9, the number of wasted bit line pre-charges is proportional to the number of discarded states per verify voltage (1) and the number of verify voltages (2), or 2. Accordingly, there is a significant reduction in the number of wasted bit line pre-charges, and the corresponding power consumption, in FIG. 9 compared to FIG. 9D.

FIG. 9E depicts a verify sequence corresponding to the first and second pre-charge data of FIG. 9B, where the first pre-charge data is used while verifying states A-D and the second pre-charge data is used while verifying states E-G. Time is on the horizontal axis and WLsel is on the vertical axis. When VvA is applied, sensing results are kept for A state cells and discarded for B-D state cells. When VvB is applied, sensing results are kept for B state cells and discarded for A, C and D state cells. When VvC is applied, sensing results are kept for C state cells and discarded for A, B and D state cells. When VvD is applied, sensing results are kept for D state cells and discarded for A-C state cells. The A-D state cells are all pre-charged during VvA-VvD. Substantial power saving are realized since the E-G state cells are not pre-charged during VvA-VvD.

When VvE is applied, sensing results are kept for E state cells and discarded for F and G state cells. When VvF is applied, sensing results are kept for F state cells and discarded for E and G state cells. When VvG is applied, sensing results are kept for G state cells and discarded for E and F state cells. The E-G state cells are all pre-charged during VvE-VvG. Substantial power saving are realized since the A-D state cells are not pre-charged during VvE-VvG.

FIG. 9F depicts a verify sequence which is an alternative to FIG. 9E, where the same pre-charge data is used while verifying states A-G. Time is on the horizontal axis and WLsel is on the vertical axis. When VvA is applied, sensing results are kept for A state cells and discarded for B-G state cells. When VvB is applied, sensing results are kept for B state cells and discarded for A and C-G state cells. When VvC is applied, sensing results are kept for C state cells and discarded for A, B and D-G state cells. When VvD is applied, sensing results are kept for D state cells and discarded for A-C and E-G state cells. When VvE is applied, sensing results are kept for E state cells and discarded for A-D, F and G state cells. When VvF is applied, sensing results are kept for F state cells and discarded for A-E and G state cells. When VvG is applied, sensing results are kept for G state cells and discarded for A-F state cells. The A-G state cells are all pre-charged during VvA-VvG.

In the sequence of FIG. 9F, the number of wasted bit line pre-charges is proportional to the number of discarded states per verify voltage (6) and the number of verify voltages (7), or 42. In contrast, in the sequence of FIG. 9E, the number of wasted bit line pre-charges is proportional to the number of discarded states per verify voltage (3) and the number of verify voltages (4) using the first pre-charge data, plus the number of discarded states per verify voltage (2) and the number of verify voltages (3) using the second pre-charge data, or 3×4+2×3=18. Accordingly, there is a significant reduction in the number of wasted bit line pre-charges, and a corresponding reduction in power consumption, in FIG. 9E compared to FIG. F. The update in the pre-charge data during the verify portion provides this advantage.

Generally, the power consumption can be determined based on the number of selected target data states (Ni) in an ith subset of selected target data states, and the number of subsets of selected target data states (S) (e.g., the number of times the pre-charge data is determined in the verify portion) as $\Sigma_{i=1}^{S} N_i \times (N_i - 1)$. In FIG. 9E, S=2, N1=4 (states A-D) and N2=3 (states E-G), so the sum is 4×3+3×2=18. In another example, S=3, N1=3 (states A-C), N2=2 (states D and E) and N3=2 (states F and G), so the sum is 3×2+2×1+2×1=10. In another example, S=4, N1=2 (states A, B), N2=2 (states C, D), N3=2 (states E, F) and N4=1 (state G), so the sum is 2×1+2×1+2×1+2×0=6. As can be seen the power consumption decreases with an increase in the number of times the pre-charge data is determined in the verify portion.

FIG. 10A depicts an example implementation of the sense module SM0 of FIG. 2C, consistent with FIGS. 7A and 7B. The sense module includes a pre-charge circuit 1005, a sense node 1004, a transistor 1002 controlled by a control gate voltage of BLC, a transistor 1001 controlled by a control gate voltage of BLS, a transfer gate 1008 controlled by a signal TG, a comparison circuit 1006, a pull down 1008 to ground and a bit line latch (BLL) controlled by a BLL signal. The transistor 1001 is connected to a bit line BL0 and NAND string NS0.

Figure 10B:
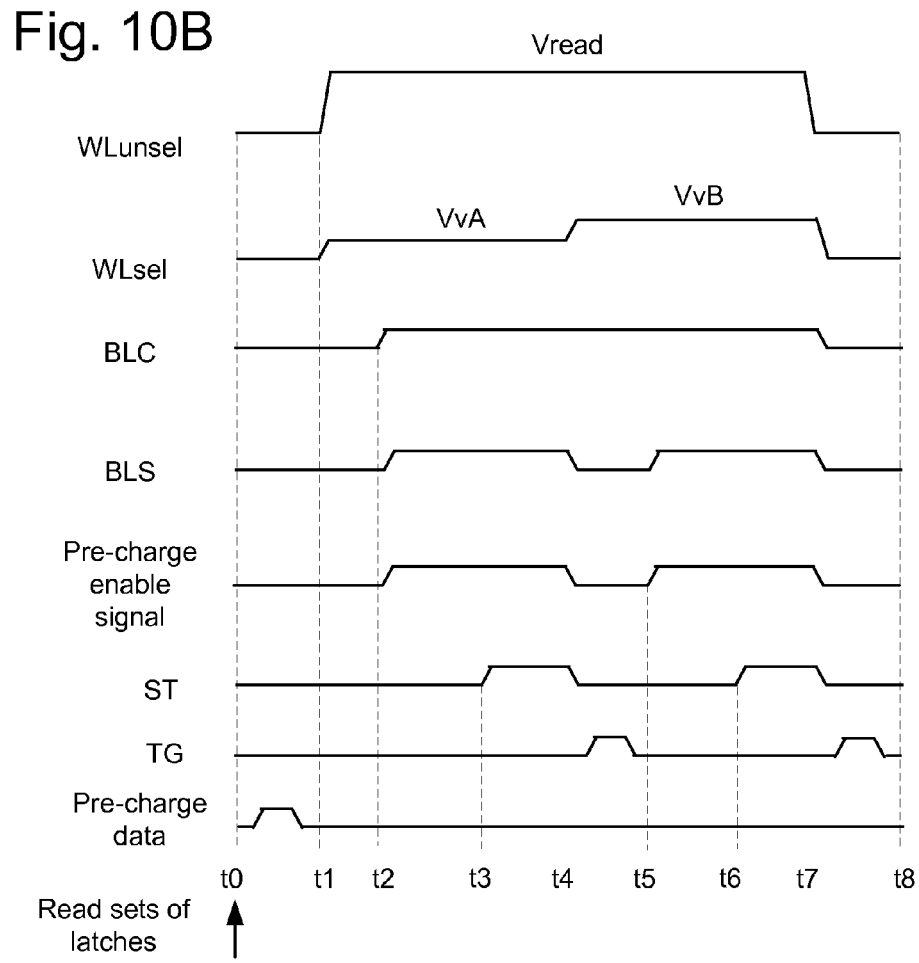
FIG. 10B depicts control signals and voltage waveforms for the verify portion of a program-verify iteration consistent with the SM0 of FIG. 10A and with FIG. 9C.

FIG. 10B depicts control signals and voltage waveforms for the verify portion of a program-verify iteration consistent with the SM0 of FIG. 10A and with FIG. 9C. In this example, sensing occurs for selected memory cells with target data states A and B. At a time t1, the voltage on the unselected word lines, WLunsel, is increased to a level Vread which sets the associated memory cells in a conductive state. Also, the voltage on the selected word line, WLsel, is set to VvA for sensing relative to the A state. After the word line voltages stabilize from t1-t12, BLC is raised to make the transistor 1002 conductive and BLS is raised to make the transistor 1001 conductive. Additionally, the pre-charge enable signal is raised to cause the pre-charge circuits to charge the bit lines, depending on pre-charge data which has previously been provided in the pre-charge circuits. Thus, some pre-charge circuits have previously been configured with pre-charge data which indicates they should provide a pre-charge when the pre-charge enable signal is high. No pre-charge occurs in other pre-charge circuits which have previously been configured with data which indicates they should not provide a pre-charge when the pre-charge enable signal is high. In one example, all of the A and B state cells which are not in the lockout state have their bit lines pre-charged during VvA.

The configuring of the pre-charge circuits with pre-charge data which allows or prevents bit line pre-charge can occur during the program portion of a program verify iteration, or at the start of the verify portion of a program verify iteration, for instance. This example show pre-charge data being transferred from the processor to a pre-charge circuit. This data may be maintained in the pre-charge circuits throughout the verify portion of the program-verify iteration, as in this example, or the data may be updated one or more additional times throughout the verify portion of the program-verify iteration, such as discussed previously.

The transistor 1002 clamps a voltage on the bit line while the pre-charge circuit provides current to the bit line. A voltage is set at the sense node which is a function of the conductive state of the memory cell being sensed. From t2-t3, the signal ST is raised to make the transistor 1003 conductive so that the sense node is in communication with the current comparison circuit 1006. The current comparison circuit 1006 determines whether the sensed current level is above a reference level. If the sensed current is above the reference level, the memory cell is in a conductive state and has not completed programming. In this case, the current comparison circuit does not instruct the bit line latch 1007 to enter a lockout state. If the sensed current is below the reference level, the memory cell is in a non-conductive state and has completed programming. In this case, the current comparison circuit instructs the bit line latch 1007 to enter a lockout state for a remainder of the programming operation. In the lockout state, the pull down circuit 1008 is activated to ground the sense node. Between t4 and t5, TG is raised to allow the level of the sense node to be read out by the processor 192 via the bus 172. If the sense node is grounded, the processor knows that the memory cell is in the lockout state. If the sense node is not grounded, the processor knows that the memory cell is not in the lockout state.

At t5, the pre-charge enable signal is raised again. In one example, all of the A and B state cells which are not in the lockout state have their bit lines pre-charged during VvB. Also at t6, sensing relative to the B state begins by applying VvB to WLsel. From t6-t7, ST is raised and the current comparison circuit 1006 determines whether the sensed current level is above a reference level. If the sensed current level is below a reference level, the bit line latch 1007 enters a lockout state and the pull down circuit 1008 is activated to ground the sense node. Between t7 and t7, TG is raised to allow the level of the sense node to be read out by the processor 192 via the bus 172.

FIG. 10C depicts control signals and voltage waveforms for the verify portion of a program-verify iteration consistent with the SM0 of FIG. 10A and with FIG. 9E. In this example, pre-charge data is set a first time between t0-t1 based on a read of the sets of latches at t1, and a second time between t9410 based on a read of the sets of latches at t9. Pre-charging of bit lines relative to the A, B, C or D state occurs from t2-t3, t4-t5, t6-t7 and t8-t9, respectively. Pre-charging of bit lines relative to the E, F or G state occurs from t11-t12, t13-t14 and t15-t16, respectively.

Accordingly, it can be seen that, in one embodiment, a method for operating a memory device comprises: applying a program voltage to a word line connected to a set of memory cells in one program-verify iteration of a plurality of program-verify iterations of a programming operation while allowing programming of selected memory cells in the set of memory cells and inhibiting programming of unselected memory cells in the set of memory cells; based on a position of the one program-verify iteration in the plurality of program-verify iterations, determining NS selected target data states, NS is a number >=2, and NU unselected target data states, NU is a number >=1; identify, among the selected memory cells, memory cells which have the NS selected target data states and memory cells which have the NU unselected target data states; and performing a verify portion of the one program-verify iteration, the performing the verify portion comprises applying the number NS of verify voltages to the set of memory cells while sensing the memory cells which have the NS selected target data states and not sensing the memory cells which have the NU unselected target data states, the sensing the memory cells which have the NS selected target data states comprises pre-charging bit lines associated with the memory cells which have the NS selected target data states, and the not sensing the memory cells which have the NU unselected target data states comprises not pre-charging bit lines associated with the memory cells which have the NU unselected target data states.

In another embodiment, a memory device comprises: a word line connected to a set of memory cells; a plurality of bit lines comprising one bit line per memory cell of the set of memory cells; a sensing circuitry associated with the plurality of bit lines; and a control circuit. The control circuit: in one program-verify iteration of a plurality of program-verify iterations of a programming operation, applies a program voltage to the word line while allowing programming of selected memory cells in the set of memory cells and inhibiting programming of unselected memory cells in the set of memory cells; based on a position of the one program-verify iteration in the plurality of program-verify iterations, determines NS selected target data states, NS is a number >=2, and NU unselected target data states, NU is a number >=1; identifies, among the selected memory cells, memory cells which have the NS selected target data states and memory cells which have the NU unselected target data states; and to perform a verify portion of the one program-verify iteration, applies the number NS of verify voltages to the set of memory cells while sensing the memory cells which have the NS selected target data states and not sensing the memory cells which have the NU unselected target data states, the sensing the memory cells which have the NS selected target data states comprises pre-charging bit lines associated with the memory cells which have the NS selected target data states, and the not sensing the memory cells which have the NU unselected target data states comprises not pre-charging bit lines associated with the memory cells which have the NU unselected target data states.

In another embodiment, a method for sensing in a memory device comprises: for one program-verify iteration of a plurality of program-verify iterations of a programming operation for a set of memory cells, determining one or more selected target data states and one or more unselected target data states; for another program-verify iteration of the plurality of program-verify iterations, determining one or more selected target data states and one or more unselected target data states, the one or more selected target data states in the one program-verify iteration are different at least partly than the one or more selected target data states in the another program-verify iteration, and the one or more unselected target data states in the one program-verify iteration are different at least partly than the one or more unselected target data states in the another program-verify iteration; during the one program-verify iteration, identifying, among the set of memory cells, memory cells to be programmed to the one or more selected target data states in the one program-verify iteration and memory cells to be programmed to the one or more unselected target data states in the one program-verify iteration, and sensing, including pre-charging, bit lines associated with the memory cells to be programmed to the one or more selected target data states in the one program-verify iteration while preventing sensing, including pre-charging, of bit lines associated with the memory cells to be programmed to the one or more unselected target data states in the one program-verify iteration; and during the another program-verify iteration, identifying, among the set of memory cells, memory cells to be programmed to the one or more selected target data states in the another program-verify iteration and memory cells to be programmed to the one or more unselected target data states in the another program-verify iteration, and sensing, including pre-charging, bit lines associated with the memory cells to be programmed to the one or more selected target data states in the another program-verify iteration while preventing sensing, including pre-charging, of bit lines associated with the memory cells to be programmed to the one or more unselected target data states in the another program-verify iteration.

The foregoing detailed description of the invention has been presented for purposes of illustration and description. It is not intended to be exhaustive or to limit the invention to the precise form disclosed. Many modifications and variations are possible in light of the above teaching. The described embodiments were chosen to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus, comprising:
a memory cell;
a sense circuit connected to the memory cell via a bit line;
a control circuit, the control circuit configured to perform a program operation for the memory cell to program the memory cell to a target data state and selectively test the memory cell using the sense circuit during the program operation, the selective testing includes charging the bit line; and
a processor connected to the sense circuit, the processor configured to make a determination that the target data state matches one data state of a set of predetermined data states and, in response to the determination, cause the sense circuit to perform the selective testing of the memory cell relative to each data state of the set of predetermined data states, and cause the sense circuit to not charge the bit line during selective testing of another memory cell relative to a data state which is not in the set of predetermined data states.

2. The apparatus of claim 1, wherein:
the control circuit, to selectively test the memory cell, is configured to apply a set of verification signals to the memory cell; and
the set of verification signals comprises a different level for each data state of the set of predetermined data states.

3. The apparatus of claim 2, wherein:
the set of verification signals comprises at least one additional level used for testing memory cells relative to at least one additional data state; and
the memory cell is not tested relative to the at least one additional data state.

4. The apparatus of claim 2, wherein:
the sense circuit, to perform the selective testing of the memory cell, is configured to make a determination of whether the memory cell is in a conductive state during each of the different levels of the set of verification signals.

5. The apparatus of claim 1, wherein:
the processor is configured to activate the sense circuit during the selective testing of the memory cell relative to each data state of the set of predetermined data states and to not activate the sense circuit during testing of an additional memory cell relative to an additional data state.

6. The apparatus of claim 5, wherein:
the memory cells are connected to a common word line.

7. The apparatus of claim 1, wherein:
the processor is configured to discard sensing results from the selective testing of the memory cell relative to one or more data states in the set of predetermined data states which are a mismatch to the target data state of the memory cell, and to transfer to a managing circuit, sensing results from the selective testing of the memory cell relative to a data state in the set of predetermined data states which matches the target data state of the memory cell.

8. The apparatus of claim 1, wherein:
the sense circuit is configured to make a determination of whether the memory cell is in a conductive state during the selective testing of the memory cell relative to each data state of the set of predetermined data states.

9. The apparatus of claim 1, wherein:
the set of predetermined data states comprises different data states during different programming phases of the program operation.

10. The apparatus of claim 1, wherein:
the set of predetermined data states comprises a different number of data states during different programming phases of the program operation.

11. The apparatus of claim 1, further comprising:
latches associated with the sense circuit, wherein the processor is configured to read the latches to determine the target data state.

12. A method, comprising:
programming a memory cell to a target data state during a program operation, the programming comprises applying a set of verification signals to the memory cell, wherein a number of verification signals in the set of verification signals is less than a number of target data states in a plurality of available target data states, determining that the target data state of the memory cell is tested by one of the verification signals, and in response to the determining that the target data state of the memory cell is tested by the one of the verification signals, sensing the memory cell while applying each of the verification signals;
discarding sensing results from sensing of the memory cell during one or more of the verification signals which are a mismatch to the target data state of the memory cell; and
transferring to a managing circuit, sensing results from sensing of the memory cell during one of the verification signals which is a match to the target data state of the memory cell.

13. The method of claim 12, wherein:
the set of verification signals is a function of a current phase among multiple phases of the program operation.

14. The method of claim 12, wherein:
the sensing the memory cell while applying each of the verification signals comprises activating a sense circuit for the memory cell while applying each of the verification signals.

15. The method of claim 14, wherein:
the activating the sense circuit comprises charging a bit line connected to the sense circuit.

16. The method of claim 12, wherein:
the programming the memory cell comprises performing a plurality of program-verify iterations, wherein each program-verify iteration comprises a program portion and a verify portion, and the set of verification signals is applied to the memory cell and the sensing of the memory cell is performed during the verify portion of at least one of the program-verify iterations.

17. An apparatus, comprising:
a memory cell;
a sense circuit connected to the memory cell; and
a control circuit, the control circuit configured to:
- perform a program operation for the memory cell to program the memory cell to a target data state, wherein to perform the program operation, the control circuit is configured to apply a set of verification signals to the memory cell, the set of verification signals comprises a first portion for testing relative to a first set of data states and a second portion for testing relative to a second set of data states;
- make a first determination that the target data state of the memory cell is among the first set of data states;
- in response to the first determination, activate the sense circuit during the first portion of the set of verification signals to sense the memory cell relative to each data state of the first set of data states;
- make a second determination that the target data state of the memory cell is not among the second set of data states; and
- in response to the second determination, not activate the sense circuit during the second portion of the set of verification signals.

18. The apparatus of claim 17, wherein the control circuit is configured to:
during the first portion of the set of verification signals, activate sense circuits of memory cells for which a target data state is among the first set of data states, and not activate sense circuits of memory cells for which a target data state is among the second set of data states; and
during the second portion of the set of verification signals, activate sense circuits of memory cells for which a target data state is among the second set of data states, and not activate sense circuits of memory cells for which a target data state is among the first set of data states.

19. The apparatus of claim 17, wherein:
the first portion of the set of verification signals comprises a different level for each data state of the first set of data states; and
the sense circuit is configured to determine whether the memory cell is in a conductive state during each of the different levels, to discard sensing results when a level of the set of verification signals is a mismatch to the target data state, and to transfer sensing results to a managing circuit when a level of the set of verification signals is a match to the target data state of the memory cell.

20. An apparatus, comprising:
means for programming a memory cell to a target data state during a program operation, the programming comprises applying a set of verification signals to the memory cell, wherein a number of verification signals in the set of verification signals is less than a number of target data states in a plurality of available target data states, determining that the target data state of the memory cell is tested by one of the verification signals, and in response to the determining that the target data state of the memory cell is tested by the one of the verification signals, sensing the memory cell while applying each of the verification signals;
means for discarding sensing results from sensing of the memory cell during one or more of the verification signals which are a mismatch to the target data state of the memory cell; and
means for transferring to a managing circuit, sensing results from sensing of the memory cell during one of the verification signals which is a match to the target data state of the memory cell.

* * * * *